US006026286A

United States Patent [19]
Long

[11] Patent Number: 6,026,286
[45] Date of Patent: *Feb. 15, 2000

[54] RF AMPLIFIER, RF MIXER AND RF RECEIVER

[75] Inventor: John R. Long, Toronto, Canada

[73] Assignees: Nortel Networks Corporation, Montreal; Carleton University, Ottawa, both of Canada

[*] Notice: This patent issued on a continued prosecution application filed under 37 CFR 1.53(d), and is subject to the twenty year patent term provisions of 35 U.S.C. 154(a)(2).

[21] Appl. No.: 08/691,161

[22] Filed: Aug. 1, 1996

Related U.S. Application Data
[60] Provisional application No. 60/002,761, Aug. 24, 1995.

[51] Int. Cl.[7] .................................................. H04B 1/16
[52] U.S. Cl. ........................ 455/327; 455/333; 455/319; 455/341
[58] Field of Search ..................................... 455/313, 318, 455/319, 323, 324, 325, 326, 327, 333, 341, 63; 330/293, 294, 306, 277; 363/147; 257/275, 277, 531, 557; 336/200; 375/219

[56] References Cited

U.S. PATENT DOCUMENTS

| | | | |
|---|---|---|---|
| 3,727,078 | 4/1973 | Wollesen .................................. | 455/333 |
| 4,637,069 | 1/1987 | Charbonnier ............................ | 455/326 |
| 4,677,692 | 6/1987 | Sakashita et al. ....................... | 455/333 |
| 4,774,477 | 9/1988 | Rodes et al. ............................. | 330/277 |
| 4,853,652 | 8/1989 | Collin ...................................... | 330/294 |
| 4,975,658 | 12/1990 | Takayama ................................ | 330/294 |
| 5,153,466 | 10/1992 | Stein et al. ................................ | 455/63 |
| 5,166,639 | 11/1992 | Green et al. ............................. | 330/294 |
| 5,379,457 | 1/1995 | Nguyen .................................... | 455/323 |
| 5,386,130 | 1/1995 | Gamand et al. ......................... | 330/277 |
| 5,410,743 | 4/1995 | Seely et al. .............................. | 455/326 |
| 5,521,545 | 5/1996 | Terry et al. .............................. | 455/326 |
| 5,528,769 | 6/1996 | Berenz et al. ........................... | 455/313 |
| 5,539,241 | 7/1996 | Abidi et al. ............................. | 257/531 |
| 5,548,840 | 8/1996 | Heck ....................................... | 455/326 |
| 5,559,349 | 9/1996 | Cricchi et al. .......................... | 257/277 |
| 5,661,647 | 8/1997 | Washburn et al. ...................... | 363/147 |

OTHER PUBLICATIONS

"Monolithic Microstrip Component Modeling for Silicon RFIC's", J. Long, 1994 SSCTC Workshop, Toronto, Canada, Aug. 25, 1994.

"Microwave Mixers", S.A. Maas, Chapter 4, Norwood, Mass.: Artech House, 1993.

"Noise Figures of Radio Receivers", H.T. Friis, Proc. of I.R.E., vol. 32, No. 11, pp. 419–422, Jul.1944.

"A Sub–micron BiCMOS Technology for Telecommunications", R. Hadaway et al., Journal of Microelectronic Engineering, vol. 15, pp. 513–516, 1991.

"Microstrip Transmission on Semiconductor Dielectrics", T.M. Hyltin, IEEE Transactions on Microwave Theory and Techniques, vol. MTT–13, No. 6, pp. 777–781, Nov. 1965.

(List continued on next page.)

*Primary Examiner*—Reinhard J. Eisenzopf
*Assistant Examiner*—Lester G. Kincaid
*Attorney, Agent, or Firm*—Angela C. de Wilton

[57] ABSTRACT

A low voltage silicon bipolar RF (radio frequency) receiver front end includes a low noise preamplifier and double-balanced mixer. The receiver incorporates monolithic microstrip transformers for significant improvements in performance compared with silicon broadband designs. Reactive feedback and coupling elements are used in place of resistors to lower the front end noise figure through the reduction of resistor thermal noise, and this also allows both circuits to operate at supply voltages below 2 volts. Circuits fabricated using 0.8 $\mu$m Bipolar CMOS technology provide a peak npn transistor transit frequency $f_T$ of 11 GHz. At a supply voltage of 1.9 volts, the measured input third order intercept point is +2.3 dBm with a 10.9 dB single-sideband noise figure. Power dissipated is less than 5 mW. The low noise amplifier input intercept is −3 dBm with a 2.8 dB noise figure and 0.5 dB gain. Power dissipation of the preamplifier is less than 4 mW from a 1.9 V supply.

21 Claims, 8 Drawing Sheets

OTHER PUBLICATIONS

"Si IC–compatible Inductors and LC Passive Filters", N.M. Nguyen and R.G. Meyer, IEEE Journal of Solid–State Circuits, vol. 27, No. 10, pp. 1028–1031, Aug. 1990.

"Highly Integrated Transmitter RFIC With Monolithic Narrowband Tuning for Digital Cellular Handsets", K. Negus et al., Proc. of Int.'l Solid–State Circuits Conference, pp. 38–39, San Francisco, 1994.

"A Low–voltage Silicon Bipolar RF Front–end for PCN Receiver Applications", J.R. Long et al., Proc. of Int.'l Solid–State Circuits Conference, pp. 140–141, San Francisco, 1995.

"Future Directions in Silicon ICs for RF Personal Communications", P.R. Gray and R.G. Meyer, Proc. of Custom Integrated Circuits Conference, pp. 83–89, Santa Clara, 1995.

"High Q Inductors for Wireless Applications in a Complementary Silicon Bipolar Process", K.B. Ashby et al., Proc. of Bipolar and BiCMOS Circuits and Technology Meeting, pp. 179–182, Minneapolis, 1994.

"Monolithic Microwave Transformers", G.G. Rabjohn, M.Eng. thesis, Carleton Univesity, Apr. 1991 (Table of Contents only).

"Inductance Calculations", F.W. Grover, Princeton, J.J.; Van Nostrand, 1946; reprinted by Dover Publications, New York, N.Y., 1954, Chapter 5, pp. 31–44.

"Design of Planar Rectangular Microelectronic Inductors", H.M. Greenhouse, IEEE Trans. on Parts, Hybrids and Packaging, vol. PHP–10, No. 2, pp. 101–109, Jun. 1974.

"A Closed–form Expression for Representing the Distributed Nature of the Spiral Inductor", D. Krafesik and D. Dawson, Proc. of IEEE–MTT Monolithic Circuits Symposium Digest, pp. 87–91, 1986.

"A Parallel–plate Waveguide Approach to Microminiaturized, Planar Transmission Lines for Integrated Circuits", H. Guckel et al., IEEE Trans. on Microwave Theory and Techniques, vol. MTT–15, No. 8, pp. 468–476, Aug. 1967.

"Calculation of Characteristic Admittances and Coupling Coefficients for Strip Transmission Lines", D. Kammler, IEEE Trans. on Microwave Theory and Techniques, vol. MTT–16, No. 11, pp. 925–937, Nov. 1968.

"Properties of Microstriplines on Si–SiO2 System", H. Hasegawa et al., IEEE Trans. on Microwave Theory and Techniques, vol. MTT–19, No. 2, pp. 869–881, Nov. 1971.

"CAD Models of Lumped Elements on GaAs Up to 18 GHz", E. Pettenpaul et al., IEEE Trans. on Microwave Theory and Techniques, vol. MTT–36, No. 2, pp. 294–304, Feb. 1988.

"Microwave Circuit Design Using Linear and Non–Linear Techniques", G.D. Vendelin et al., Chapter 4, pp. 238–251, New York, N.Y.: Wiley, 1990.

"The Effect of Feedback on Noise Figure", S. Iversen, Proc. of the IEEE, vol. 63, pp. 540–542, Mar. 1975.

"The Noise Performance of Microwave Transistors", H. Fukui, IEEE Trans. on Electron Devices, vol. ED–13, pp. 329–341, Mar. 1966.

"Minimizing Noise in Analog Bipolar Circuit Design", D.F. Bowers, Proc. of Bipolar and BiCMOS Circuits and Technology Meeting, pp. 107–111, Minneapolis, 1989.

Bipolar and MOS Analog Integrated Circuit Design, A. Grebene, Chapter 4, pp. 451–472, and Chapter 9, pp. 193–213, New York, N.Y.: Wiley, 1984.

"A 1–GHz BiCMOS RF Front–end IC", R.G. Meyer and W.D. Mack, IEEE Journal of Solid–State Circuits, No1.29, No. 3, pp. 350–355, Mar. 1994.

"Ultra Low Power Low Noise Amplifiers for Wireless Communications", E. Heaney et al., Proc. of GaAs IC Symposium, pp. 49–51, San Jose, Calif., Oct. 1993.

"Conversion Loss and Noise of Microwave and Millimeter–wave Mixers: Part 1—Theory", D.N. Held and A.R. Kerr, IEEE Trans. on Microwave Theory and Technques, vol. MTT–26, pp. 49, Feb. 1978.

"GaAs Front–end MMICs for L–band Personal Communications", T. Ohgihara et al., IEEE 1993 Microwave and Millimeter–wave Monolithic Circuits Symposium Technical Digest, pp. 9–12, Atlanta, Georgia, Jun. 1993.

"An L–band Ultra Low Power Consumption Monolithic Low Noise Amplifier", M. Nakatsugawa et al., Proc. of the GaAs IC Symposium, pp. 45–48, San Jose, Calif., Oct. 1993.

"0.3 $\mu$m Advanced Saint FET's Having Asymmetric N+–layers for Ultra High Frequency GaAs MMIC's", T. Enoki et al., IEEE Trans. on Electron Devices, vol. ED–35, pp. 18–24, Jan. 1988.

RF AMPLIFIER, RF MIXER AND RF RECEIVER

This application claims the benefit of U.S. Provisional Application Ser. No. 60/002,761, filed Aug. 24, 1995.

TECHNICAL FIELD

The present invention relates to an RF (radio frequency) amplifier, an RF mixer and an RF receiver using the RF amplifier and the RF mixer, which are used for personal communications systems, for instance.

BACKGROUND ART

A well known low power RF receiver circuit comprises a low noise preamplifier and double-balanced mixer, using novel monolithic microstrip inductors and transformers for RF IC (integrated circuit) applications using submicron bipolar CMOS process technology, with particular application for personal communications systems.

For wireless personal communications systems, successful integration of high performance low power RF receivers, often referred to as RF "front ends", comprising a low noise preamplifier and mixer, depends heavily on the development of appropriate on-chip resonant circuits.

High frequency amplifiers in silicon integrated technology have traditionally been designed as broadband circuits using resistors (R) and capacitors (C) as the sole passive circuit elements. Typically, RC circuits are limited in their frequency range. Narrowband LC (inductor and capacitor) resonant circuits, based on GaAs technology offer higher frequency operation and reduced chip size, more suitable for modern high frequency communications systems, which are narrowband in nature and low noise.

Common LC circuit topologies have migrated progressively from discrete elements, to hybrids, to GaAs MMICs (monolithic microwave ICs). MMIC narrowband LC circuits designs are based on power matching of circuit elements. Gain is possible, ideally, up to almost fmax of the transistor. GaAs technologies have a clear advantage over silicon for this type of design, because the substrate is semi-insulating, and process options include airbridge interconnect schemes which facilitate fabrication of inductive elements.

Indeed, monolithic integration of microstrip components as inductive elements on silicon substrates has previously been considered impractical due to the high dielectric losses in the silicon substrate. However, development of multilevel metallization in modern silicon VLSI technologies has reduced the metal to substrate capacitance, thereby reducing dielectric losses at lower frequencies. Thus, more recently, interest has been revived in exploring the possibilities offered by integration of microstrip elements on silicon for cost reduced RF IC designs.

For example, U.S. Pat. No. 5,379,457 granted to N. M. Nguyen on Jan. 3, 1995 discloses a low noise active mixer. The mixer is based on a conventional Gilbert cell active mixer having two matched pairs of transistors which receive a local oscillator input signal, coupled to another matched pair of transistors which receive a radio frequency signal. The circuit generates an intermodulated output signal at the collectors of the local oscillator matched pairs. Noise degradation is reduced by replacing the standard radio frequency emitter degeneration resistor with a reactive element, thereby reducing thermal noise. Narrowband input matching is achieved by a series inductive element, e.g., a spiral inductor and an optional parallel capacitive element in line with the radio frequency input.

SUMMARY OF THE INVENTION

Thus, the present invention seeks to provide integrated circuits for low power RF receivers, including a low noise amplifier and double-balanced mixer circuit, using a narrowband circuit topology which further exploits the performance advantages offered by resonant tuning of inductive (L) and capacitive (C) elements. Integrated circuit designs are provided using microstrip inductor elements fabricated by a submicron bipolar CMOS technology.

In silicon VLSI processes, for instance, by using thick intermetal dielectric (IMD) and novel microstrip inductive elements and transformers, LC circuit designs can be fabricated for applications below 3 GHz. Extensive modelling and simulation led to the design of practical microstrip components that can be fabricated using commercial submicron bipolar CMOS technologies. These elements are used to perform impedance matching, coupling and phase splitting functions in an RF IC.

According to one aspect of the present invention, there is provided a low power RF receiver comprising a double-balanced mixer circuit and a low noise amplifier comprising an LC resonant circuit fabricated in submicron bipolar CMOS technology. In particular there is provided a transformer coupled low noise amplifier, and a double-balanced mixer in which phase splitting means comprises a monolithic microstrip transformer (e.g., a balun).

The monolithic transformer balun is used to efficiently couple the single-ended input signal from the low noise amplifier to the low power double-balanced mixer, and thereby realize a low level of harmonic distortion and a good signal-to-noise ratio.

These silicon circuit designs require a larger chip area and have reduced frequency range compared with RC silicon designs. Monolithic inductors provide several advantages over the conventional RC circuits used in silicon technology. Noise is reduced so that larger devices sizes and lower bias current can be used. Linearity is improved by using lossless feedback networks to reduce power dissipation and noise. Power supply voltage can be reduced when an inductive collector load is used, and power consumed by active matching circuitry is eliminated.

Thus, according to another aspect of the present invention there is provided an RF receiver comprising a low noise amplifier circuit for an MMIC, the amplifier having an input node and an output node and comprising: a high frequency bipolar transistor comprising a base, collector and emitter, preferably connected in common emitter configuration; and a transformer connected so that negative feedback is applied by inductive coupling from the amplifier output at the collector of the transistor back to the emitter. The transformer is provided by microstrip inductor elements (e.g. mutually coupled microstrip inductors) including an emitter inductor coupled between the emitter and ground and a collector inductor coupled between the collector and amplifier output node, the emitter inductor and collector inductor forming primary and secondary turns of the transformer respectively, the turns ratio of the transformer controlling the gain of the amplifier. Input coupling is provided by a passive LC network including an inductor element coupled between the amplifier input node and the base.

Advantageously, the amplifier gain is set by the transformer turns ratio, which is stable with respect to changes in supply voltage and ambient temperature. The amplifier can operate at supply voltages below 1 volt because IR drops in the collector and emitter, typical of conventional designs, are eliminated. A simple passive matching network comprising one capacitor and one inductor at the input is provided. Lower gain (e.g., 12 dB for n=4) is desirable if the mixer IP3 (3rd order intercept point) dominates the receiver performance. In this design, the feedback network and matching components add negligible amount of noise. The noise figure is determined by rbb' and shot noise of the bipolar transistor.

Using an on-chip transformer allowed for a 3 times larger active device to be used, giving a better noise factor at lower gain than a conventional resistive (RC) design approach.

According to a further aspect of the present invention, there is provided an RF receiver comprising a double-balanced mixer circuit for an MMIC wherein phase splitting means comprises a monolithic microstrip transformer.

In particular, the circuit comprises a monolithic microstrip transformer (e.g. balun) for splitting a radio frequency (RF) input signal, coupled to the primary coil of the transformer, into anti-phase and in-phase components, which are then fed to a cross-coupled switching quad of transistors. A current source feeds a bias current to the switching quad through a center-tap in the balun secondary coil. The signal current is chopped by the transistor quad at the local oscillator (LO) rate in order to down-convert the input signal from RF to the desired intermediate frequency (IF). The down-converted RF input signal is buffered to a 50 Ω load using an on-chip Darlington buffer, or alternately, the IF output can be impedance matched using an external matching network. The input from the local oscillator is terminated on-chip by a resistor.

The balun may be tuned by capacitors placed in parallel with primary and secondary terminals.

In providing a double-balanced mixer, the provision of a microstrip transformer provides for a novel mixer circuit in which the lower differential pair of a conventional Gilbert double-balanced mixer is replaced by a balun. Thus, the voltage drop required by the lower differential pair (i.e., phase splitter) is eliminated, allowing for lower voltage operation ($V_{CC}$<3 volts). Input matching is simplified, and a lower noise figure is possible.

Thus, monolithic microstrip transformers have been used to perform coupling and phase splitting functions in a bipolar receiver front end comprising a low noise amplifier and double-balanced mixer.

Compared to conventional designs using active and passive circuit components, the use of transformers allows a lower dc voltage drop and hence both the low noise amplifier and the double-balanced mixer can operate at a supply voltage below 2 volts.

Current drain is further reduced through the use of on-chip impedance matching which improves the circuit efficiency. Reactive feedback elements are used in place of resistors to stabilize circuit performance with process and temperature, allowing a significant improvement in the noise figure by reducing resistor thermal noise.

Thus, opportunities for performance improvements of RF front ends are achieved by incorporating on-chip inductors and transformers into silicon circuit designs. Circuits are based on used of high impedance transmission lines wrapped in a spiral, to form inductor elements with reduced physical dimensions, increased inductance and improved inductor and transformer quality (Q).

Adequate performance in the 1–3 GHz range can be achieved with circuits fabricated with a bipolar-CMOS VLSI process, allowing for development of more highly integrated monolithic receivers.

BRIEF DESCRIPTION OF THE DRAWINGS

Embodiments of the invention will now be described by way of example, with reference to the accompanying drawings, in which.

DETAILED DESCRIPTION

I. Structure of the Receiver-Transmitter

Figure 1:
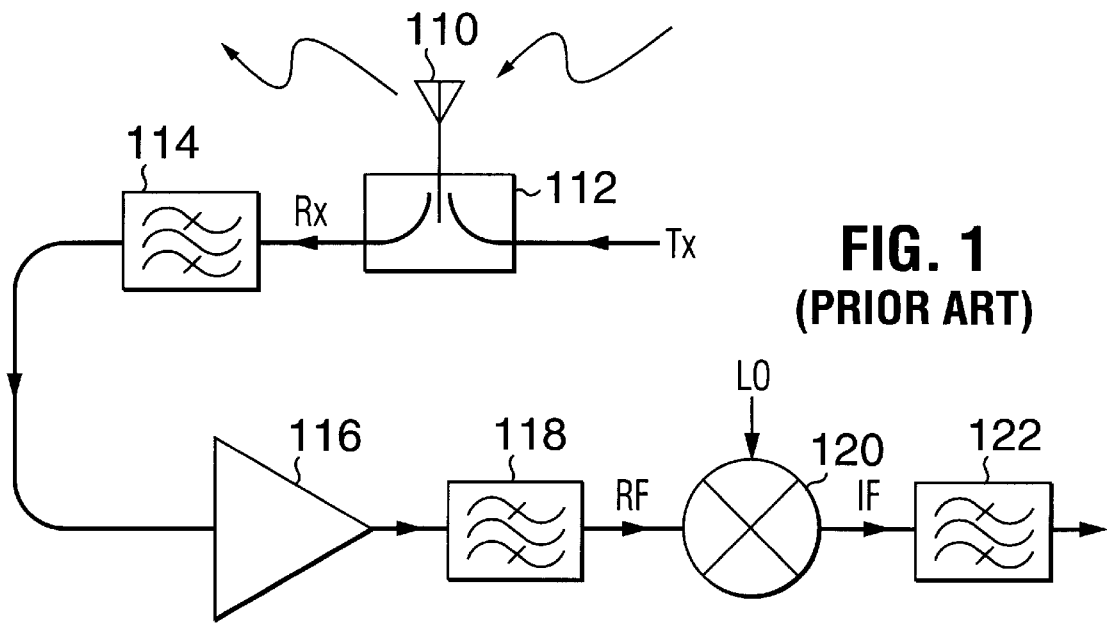
FIG. 1 is a schematic block diagram of the first stage of a typical generic radio receiver-transmitter.

A system block diagram of the first stage of a typical generic radio receiver-transmitter is illustrated in FIG. 1. In FIG. 1, a receiving signal Rx provided by an antenna 110 and a duplexer 112 is filtered by an IR filter 114 and the filtered signal is amplified by a front-end preamplifier 116. The amplified signal is again filtered by an IR filter 118 and a radio frequency signal RF is provided therefrom to a mixer 120 which receives a local frequency signal LO from a local signal oscillator (not shown). The radio frequency signal RF is mixed with the local frequency signal LO by the mixer 120 to provide an intermediate frequency signal IF. The intermediate frequency signal IF is filtered by an IF filter 122 and a filtered intermediate frequency signal is provided to the second stage (not shown) of the radio receiver-transmitter. The transmitter (not shown) provides a transmitting signal Tx which in turn is sent via the duplexer 112 and the antenna 110.

This facilitates signal processing at a lower frequency where higher quality filters and amplifiers can be economically constructed. The spurious free dynamic range of the receiver is the single most important performance specification for the receiver front-end. It is defined by the difference between the overload point and the minimum discernible or acceptable signal level at the RF input of the front-end preamplifier 116. The minimum signal level or receiver sensitivity is determined by the receiver noise figure (NF), which can be estimated from Friis' formula (e.g., H. T. Friis, "Noise Figures of Radio Receivers", Proceedings of the I.R.E., Vol. 32, No. 11, pp. 419–422, July 1944). The upper limit of the receiver dynamic range is usually determined by the mixer's distortion and gain compression characteristics, when a preamplifier with sufficient gain to adequately suppress the mixer noise is used.

II. Prior Art Mixer

Figure 2:
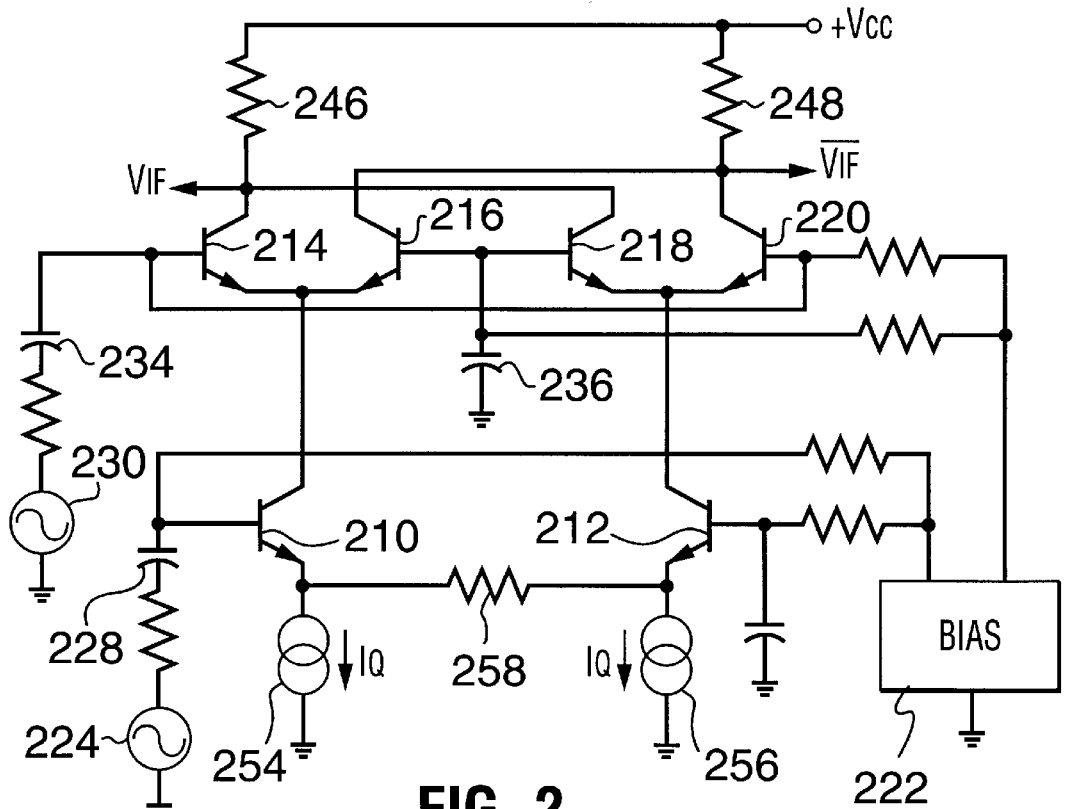
FIG. 2 is a schematic diagram of a conventional prior art Gilbert cell double-balanced mixer.

FIG. 2 shows a conventional prior art Gilbert cell double-balanced mixer which is described in U.S. Pat. No. 5,379,457 granted to N. M. Nguyen on Jan. 3, 1995. In FIG. 2, the mixer includes a radio frequency differential pair of transistors 210 and 212, two local oscillator differential pairs of transistors 214, 216 and transistors 218, 220, and a bias circuit 222. A single-ended radio frequency signal source 224 is coupled to the base of the transistor 210 via a capacitor 228. A single-ended local frequency signal source 230 is coupled to the bases of the transistor 214 and 220 via a capacitor 234. The bases of the transistors 216 and 218 are connected to the ground terminal via a capacitor 236. A voltage $+V_{CC}$ is supplied to the collectors of the transistors 214 and 218 are via resistors 246 and 248, respectively. The transistors 210 and 212 of the radio frequency differential pair are driven by equal current IQ provided by two current sources 254 and 256. The emitters of the transistors 210 and 212 are connected by a degeneration resistor 258. An intermediate voltage signal is provided between the collectors of the transistors 214 and 220.

Figure 3:
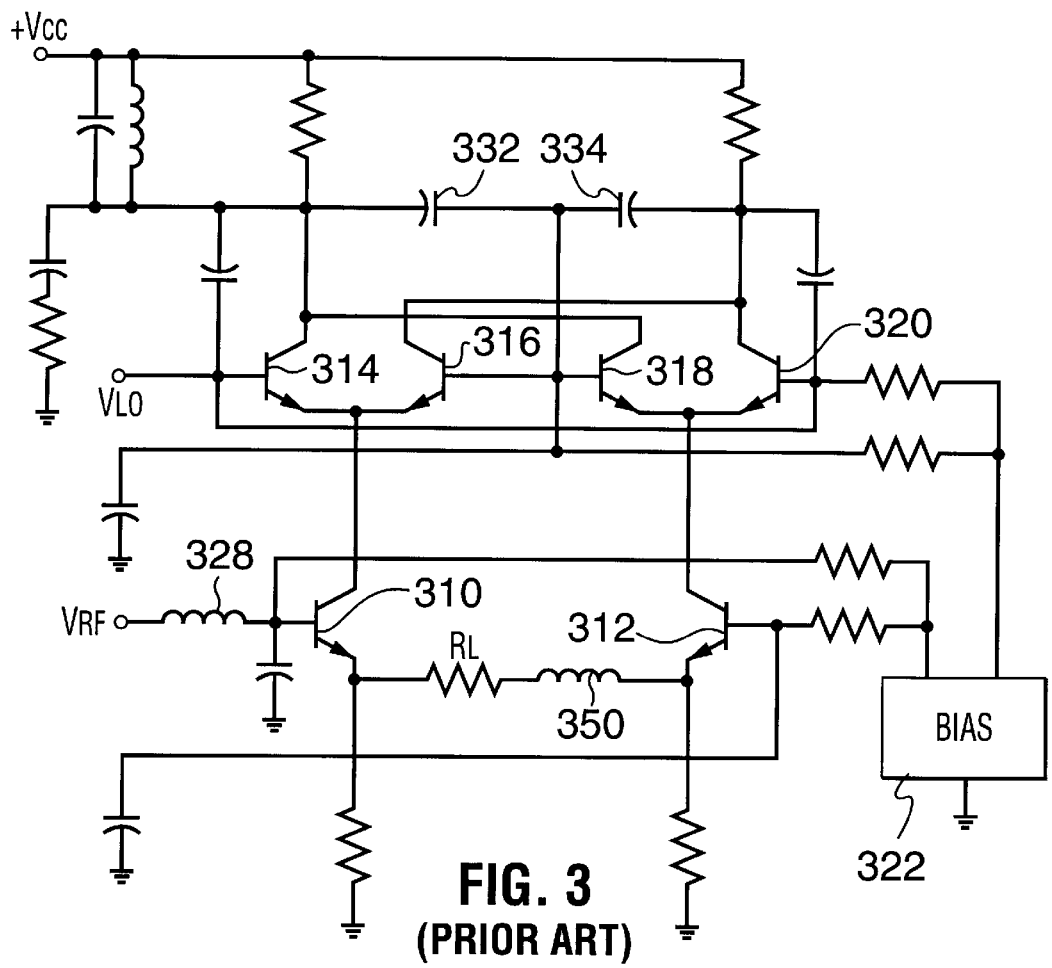
FIG. 3 is a schematic diagram of another prior art double-balanced mixer cell.

FIG. 3 is a schematic diagram of another prior art double-balanced mixer cell which is disclosed in U.S. Pat. No. 5,379,457 granted to N. M. Nguyen on Jan. 3, 1995. In FIG. 3, the mixer includes a radio frequency differential pair of transistors 310 and 312, two local oscillator differential pairs of transistors 314, 316 and transistors 318, 320, and a bias circuit 322. Two capacitors 332 and 334 are connected in series between the collectors of the transistors 314 and 320. The junction of the two capacitors 332 and 334 is connected to the bases of the transistors 316 and 318. A spiral inductor 350 is connected between the emitters of the transistors 310 and 312. $R_L$ represents the resistive loss of the inductor 350. A single-ended radio frequency voltage $V_{RF}$ is fed via an inductor 328 to the base of the transistor 310. A single-ended local frequency voltage $V_{LO}$ is fed to the bases of the transistors 314 and 320. An intermediate signal is provided between the collectors of the transistors 314 and 320. By inserting the inductor 354 and replacing the noisy degeneration resistor 258 (FIG. 2) by the inductor 350, thermal noise is reduced and narrowband input matching is achieved.

III. Embodiment of the Present Invention

The following description assumes, for simplicity and purely by way of example, that the transistors referred to are npn bipolar devices.

(i) RF preamplifier for the front-end preamplifier 116

Figure 4:
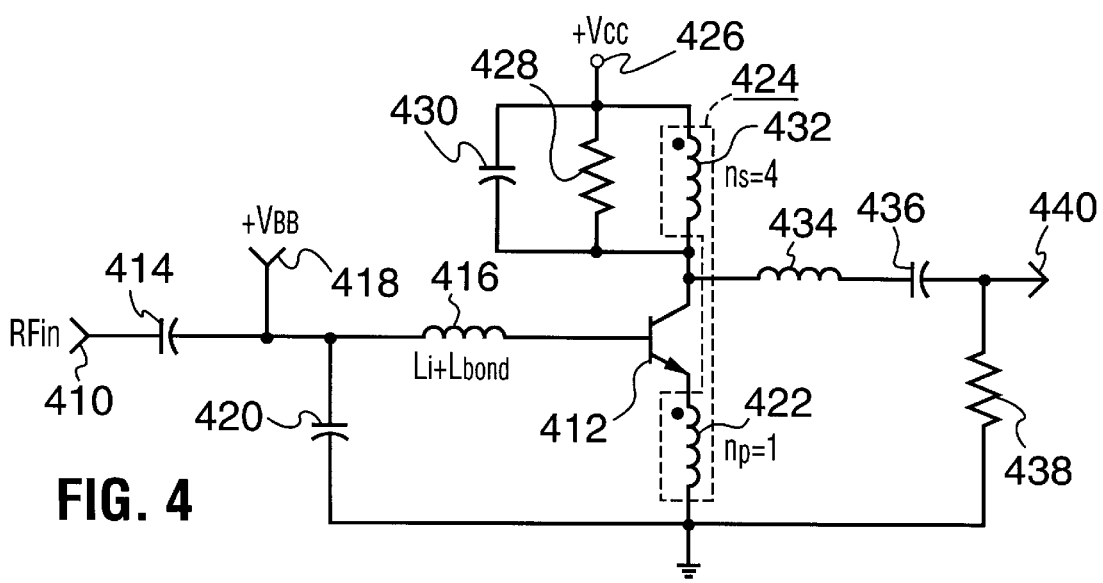
FIG. 4 is a schematic diagram of a part of an integrated circuit for a low power RF receiver comprising a transformer coupled low noise amplifier (RF preamplifier) according to an embodiment of the present invention.

FIG. 4 shows a part of an integrated circuit for a low power RF receiver comprising a transformer coupled low noise RF amplifier according to an embodiment of the present invention. In FIG. 4, an RF input terminal 410 is connected to the base of a transistor 412 via a series-connected capacitor 414 and inductor 416 (of Li and $L_{bond}$). The junction of the capacitor 414 and the inductor 416 is connected to a bias voltage terminal 418 of $+V_{BB}$ and via a capacitor 420 to the ground terminal. The emitter of the transistor 412 is connected to the ground terminal via a primary winding 422 of a transformer 424. The collector of the transistor 412 is connected to a voltage supply terminal 426 of a positive voltage $+V_{CC}$ via a resistor 428. A capacitor 430 and a secondary winding 432 of the transformer 424 are connected in parallel to the resistor 428. The turns ratio (np:ns) of the primary and secondary windings of the transformer 424 is 1:4. An inductor 434, a capacitor 436 and an effective load resistor 438 are connected in series between the collector of the transistor 412 and the ground terminal. The capacitor 436 is connected to an RF output terminal 440, and the resistor 438.

Operation of the RF amplifier will be described later.

(ii) Double-balanced mixer for the mixer 120

Figure 5:
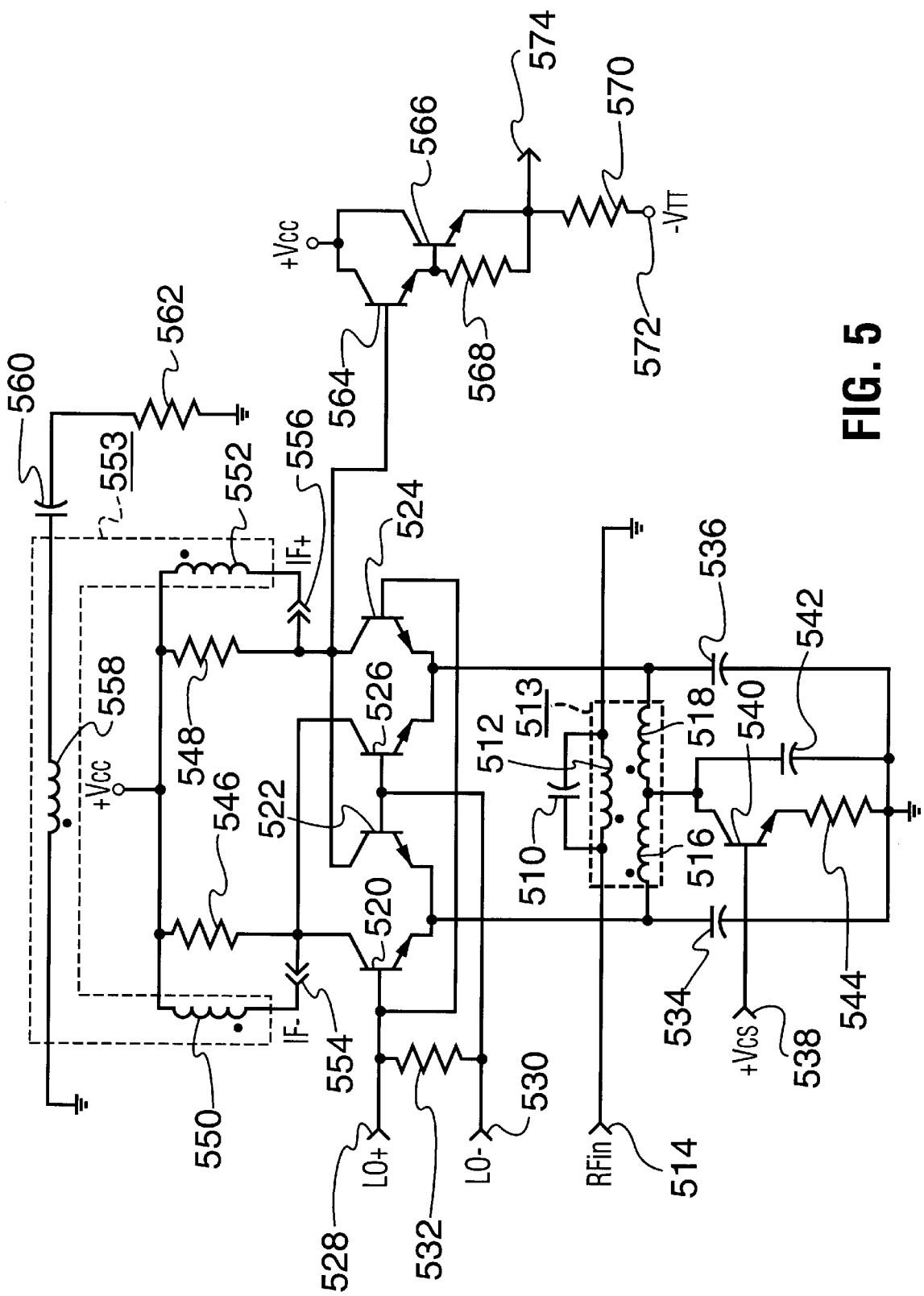
FIG. 5 is a schematic diagram of a part of an integrated circuit for a low power RF receiver comprising a double-balanced mixer according to an embodiment of the present invention.

FIG. 5 shows a part of an integrated circuit for a low power RF receiver comprising a double-balanced mixer according to an embodiment of the present invention. In FIG. 5, a capacitor 510 and a primary winding 512 of a balun 513 are connected in parallel between an RF input terminal 514 and the ground terminal. Two series-connected secondary windings 516 and 518 of the balun 513 are connected between the emitters of two transistors 520, 522 and the emitters of two transistors 524, 526. The bases of the transistors 520 and 522 are connected to the LO input terminals 528 and 530 (LO+, LO−), respectively. Similarly, the bases of the transistors 524 and 526 are connected to the LO input terminals 528 and 530, respectively. A resistor 532 is connected between the LO input terminals 528 and 530. A capacitor 534 is connected between the emitters of the transistors 520, 522 and the ground terminal. A capacitor 536 is connected between the emitters of the transistors 524, 526 and the ground terminal. A current control input terminal 538 of a positive voltage $+V_{CS}$ is connected to the base of a transistor 540, the collector of which is connected to the junction (i.e., the center-tap) of the secondary windings 516 and 518 of the balun 513. A capacitor 542 is connected between the collector of the transistor 540 and the ground terminal. A resistor 544 is connected between the emitter of the transistor 540 and the ground terminal.

The collectors of the transistors 520, 526 and the transistor 524, 526 are connected to the voltage supply terminal of $+V_{CC}$ via resistors 546 and 548, respectively. Series-connected primary windings 550 and 552 of a balun 553 are connected between IF terminals 554 and 556, which are connected to the collectors of the transistors 520 and 524, respectively. The junction (i.e., the center-tap) of the primary windings 550 and 552 is connected to the voltage supply terminal of $+V_{CC}$. One end terminal of a secondary winding 558 of the balun 553 is directly connected to the ground terminal and the other end terminal of the secondary winding 558 is connected to the ground terminal via a series-connected capacitor 560 and resistor 562.

The collectors of the transistors 522 and 524 are connected the base of a transistor 564, the emitter of which is connected to the base of a transistor 566. The collectors of the transistors 564 and 566 are connected to the voltage supply terminal of $+V_{CC}$. A resistor 568 is connected between the base and the emitter of the transistor 566. A resistor 570 is connected between the emitter of the transistor 566 and a voltage terminal 572 of a negative voltage $-V_{TT}$. The emitter of the transistor 566 is connected to an output terminal 574.

These circuits use inductive elements to perform impedance matching, coupling and phase splitting functions in the RF IC. These circuits will be described in more detail below after discussion of design considerations, simulation and experimental testing, of individual inductive elements and transformers fabricated using a silicon based technology.

IV. Fabrication Process

A fabrication process of the above circuits will now be described. The process used to fabricate the RF preamplifier and the double-balanced mixer is 0.8 μm Bi-CMOS process, which is for example described in a paper by R. Hadaway et al, "A Sub-micron BiCMOS Technology for Telecommunications", Journal of Microelectronic Engineering, Vol. 15, pp. 513–516, 1991).

(i) Bipolar device:

Bipolar devices were chosen for the front-end circuit implementation because of their superior unity power gain frequency ($f_{MAX}$) when compared to MOS devices. A summary of the electrical parameters for a minimum size bipolar transistor is given in the right column of Table 2.

These npn bipolar devices are optimized for digital applications with a 5V power supply. A relatively high transistor transit frequency ($f_T$) is achieved through the use of a polysilicon emitter contact. However, the area required to electrically contact the extrinsic base region results in large collector-base capacitance ($C_{JC}$) and a large extrinsic base resistance ($r_{bb}'$) when compared to bipolar IC processes that are optimized for RF performance. This limits the transistor $f_{MAX}$ and the power gain that can be achieved by a preamplifier connected in the common emitter configuration, as well as limiting the minimum amplifier noise figure (NFmin). Resonant tuning using inductance can be used to reduce the effect of transistor parasitics on the circuit performance, but a transistor of increased size is needed to minimize the noise introduced by the extrinsic base resistance.

Figure 6A:
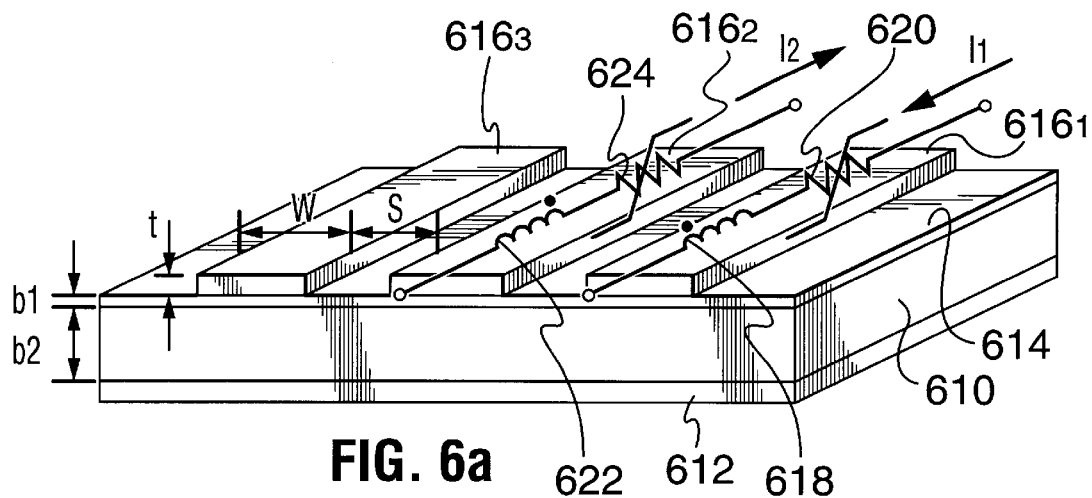
FIGS. 6a, 6b and 6c are schematic diagrams of a cutaway view of coupled microstrip lines on a silicon substrate integrated circuit.
Figure 6B:
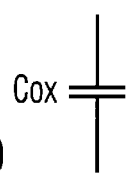
Figure 6C:
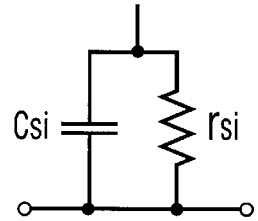

Substrate and metallization properties, which define the properties of a microstrip line in the BiCMOS process, are shown in Table 1. A cutaway view of two coupled microstrip transmission lines on silicon is shown in FIGS. 6(a)–(c) to illustrate some of the key parameters. In FIG. 6(a), a silicon layer 610 with a thickness b2 is formed on a ground plane 612. A silicon dioxide layer 614 of a thickness b1 is formed on the other surface of the silicon layer 610. Three top conductors 616₁, 616₂ and 616₃ are formed on the silicon dioxide layer 614. Each top conductor has a thickness t and a width W. The top conductors are spaced by a distance S. The top conductor 6161 forms an inductance element 618 and a resistance element 620. The top conductor 6162 forms an inductance element 622 and a resistance element 624. The silicon dioxide layer 614 forms a capacitance element Cox as shown in FIG. 6(b). The silicon layer 610 forms parallel-connected capacitance element Csi and resistance element rsi as shown in FIG. 6(c).

Figure 7:
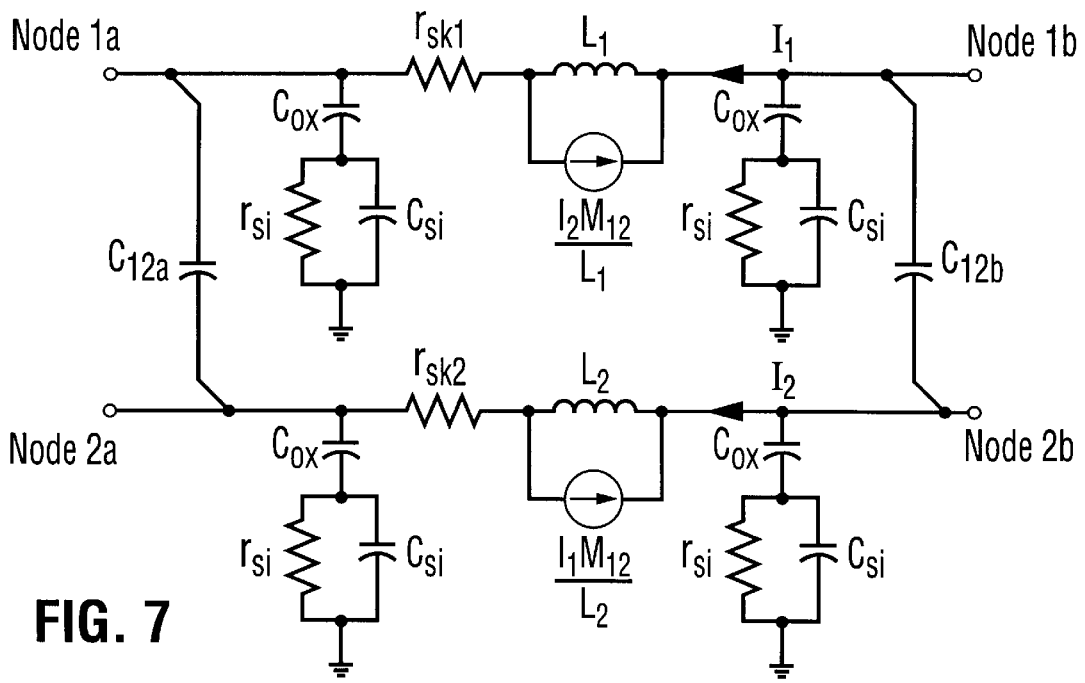
FIG. 7 is a schematic diagram of a lumped element circuit model for coupled microstrip lines on silicon, as illustrated by FIG. 6.

FIG. 7 is a schematic diagram of a lumped element circuit model for coupled micostrip lines on silicon, as illustrated by FIG. 6.

Relatively thin metallization typically used in multilevel VLSI metallization schemes, limits the quality factor of microstrip inductors or transformers fabricated using this process, because energy is dissipated by the finite resistivity of the metallization as well as in the conductive substrate. However, a thick intermetal oxide dielectric limits the parasitic capacitance between the top level metal and the substrate, and this helps to improve the self-resonant frequency of these passive components.

The quality of microstrip transmission lines fabricated on silicon substrates is degraded by dielectric losses in the conductive substrate as the signal frequency increases (T. M. Hyltin, "Microstrip Transmission on Semiconductor Dielectrics", IEEE Transactions on Microwave Theory and Techniques, Vol. MTT-13, No. 6, pp. 777–781, Nov. 1965). However, modern silicon VLSI technologies with multiple levels of metal used for circuit interconnections have a relatively low capacitance between the top layer of metal and the substrate. This development combined with a substrate resistivity on the order of between 1 and 100 Ω-cm can result in an acceptable level of dielectric loss in the 1–3 GHz frequency range.

Recognition of this fact has revived interest in exploring the possibilities offered by the integration of microstrip elements on silicon for RFIC designs (N. M. Nguyen and R. G. Meyer, "Si IC-compatible Inductors and LC Passive Filters", IEEE Journal of Solid-State Circuits, Vol. 27, No. 10, pp. 1028–1031, August 1990; K. Negus, B. Koupal, J. Wholey, K.Carter, D. Millicker, C. Snapp, and N. Marion, "Highly Integrated Transmitter RFIC With Monolithic Narrowband Tuning for Digital Cellular Handsets", Proceedings of the International Solid-State Circuits Conference, San Francisco, 1994, pp. 38–39). There is also a publication co-authored by the current inventor, and describing the embodiments: J. R. Long, M. A. Copeland, P. Schvan and R. Hadaway, "A Low-voltage Silicon Bipolar RF Front-end for PCN Receiver Applications", Proceedings of the International Solid-State Circuits Conference, San Francisco, 1995, pp. 140–141 which is incorporated herein by reference.

(ii) Monolithic Microstrip Transformers:

Monolithic microstrip transformers integrated in BiCMOS VLSI technology are used to perform impedance matching, coupling and phase-splitting functions in the RF front-end.

Optimization and refinement of circuit designs incorporating on-chip inductors and transformers have been identified by others as lacking in the present state of the design art, for example, P. R. Gray and R. G. Meyer, "Future Directions in Silicon ICs for RF Personal Communications", Proc. of the Custom Integrated Circuits Conference, Santa Clara, 1995, pp. 83–89; K. B. Ashby, W. C. Finley, J. J. Bastek, S. Moinian, and I. A. Koullias, "High Q Inductors for Wireless Applications in a Complementary Silicon Bipolar Process", Proc. of the Bipolar and BiCMOS Circuits and Technology Meeting, Minneapolis, 994, pp. 179–182.

A computationally efficient, scalable lumped-element model was therefore developed for the embodiment, which can be applied to any configuration of microstrip lines, not just spiral inductors or transformers. A physically-based, lumped-element model is extracted from the circuit layout and substrate parameters, which can then be used in either a time-domain (e.g., SPICE) or frequency domain (e.g., Touchstone) simulation. This approach to component modelling is more efficient than 3-D electromagnetic simulation techniques (G. G. Rabjohn, "Monolithic Microwave Transformers", M.Eng. thesis, Carleton University, April 1991), and is disclosed here to be sufficiently accurate for RF applications up to a few GHz.

As an example of this technique, a circuit model can be derived for the pair of coupled microstrip lines illustrated in FIG. 6. The physical length of a microstrip line on an RFIC is typically less than 1 mm, which is much less than the guided wavelength for applications below 3 GHz. A lumped-element π-equivalent circuit can therefore be used to accurately model each individual microstrip line. Two such π-equivalents are shown in FIG. 7 for two adjacent microstrip lines, as well as mutual capacitive coupling between the lines (represented by $C_{12a}$ and $C_{12b}$). The parameters of the lumped-element model for each microstrip line are computed from the layout geometry, and the substrate and metallization properties listed in Table 1. The self- and mutual-inductances for all parallel line segments are calculated from closed-form expressions (F. W. Grover, "Inductance Calculations", Princeton, N.J.: Van Nostrand, 1946, reprinted by Dover Publications, New York, N.Y., 1954), where the non-zero metallization thickness is incorporated in the self- and mutual-inductance calculations using the geometric mean distance of the conductor cross-section (H. M. Greenhouse, "Design of Planar Rectangular Microelectronic Inductors", IEEE Transactions on Parts, Hybrids and Packaging, Vol. PHP-10, No. 2, pp. 101–109, June 1974).

The effect of the current induced in the ground plane is also accounted for as described by D. Krafesik and D. Dawson, "A Closed-form Expression for Representing the Distributed Nature of the Spiral Inductor", Proceedings of the IEEE-MTT Monolithic Circuits Symposium Digest, 1986, pp. 87–91, while current induced in the substrate can be neglected in the GHz frequency range, because the substrate resistivity for the BiCMOS process is sufficiently large (H. Guckel, P. A. Brennan and I. Palocz, "A Parallel-plate Waveguide Approach to Microminiaturized, Planar Transmission Lines for Integrated Circuits", IEEE Transactions on Microwave Theory and Techniques, Vol. MTT-15, No. 8, pp. 468–476, Aug. 1967).

The self- and mutual-capacitances are computed using a two-dimensional numerical technique developed for coupled microstrip lines (D. Kammler, "Calculation of Characteristic Admittances and Coupling Coefficients for Strip Transmission Lines", IEEE Transactions on Microwave Theory and Techniques, Vol. MTT-16, No. 11, pp. 925–937, Nov. 1968). The shunt resistance of the semiconducting layer can then be estimated directly from the quasi-static capacitance, $C_{Si}$ (H.

Hasegawa M. Furukawa and H. Yanai, "Properties of Microstriplines on Si-SiO2 System", IEEE Transactions on Microwave Theory and Techniques, Vol. MTT-19, No. 2, pp. 869–881, Nov. 1971).

Dissipation of the mutual capacitances can be neglected when the microstrip lines are closely spaced. The frequency dependent resistances $r_{sk1}$ and $r_{sk2}$ are determined from closed-form expressions of E. Pettenpaul H. Kapusta, A. Weisgerber, H. Mampe, J. Luginsland and I. Wolff, in "CAD Models of Lumped Elements on GaAs Up to 18 GHz", IEEE Transactions on Microwave Theory and Techniques, Vol. MTT-36, No. 2, pp.294–304, Feb. 1988, to form a complete lumped-element equivalent circuit representation. The circuit model can be directly used in a time domain or frequency domain circuit simulation along with other active and passive RF elements. The complete model would normally be reduced to a compact model or S-parameter representation for faster optimization of a complex RF circuit.

This technique can be extended to more than two coupled lines and applied to the analysis of spiral microstrip components, such as an inductor or a transformer. The physical layout of a microstrip spiral is first partitioned into four groups of multiple coupled lines for analysis; one group per side of the rectangular layout. A lumped element π-section is again used to model each individual microstrip line within a group, where it should be noted that the assumption of "electrically short" transmission lines is normally satisfied, for the outside dimensions of the rectangular spiral are usually less than 1 mm. Assuming N=8 microstrip lines per side, for example, there would be 4N or 32 lumped element sections, along with the additional interconnecting elements to model the mutual capacitance between strips as in FIG. 7.

Figure 8:
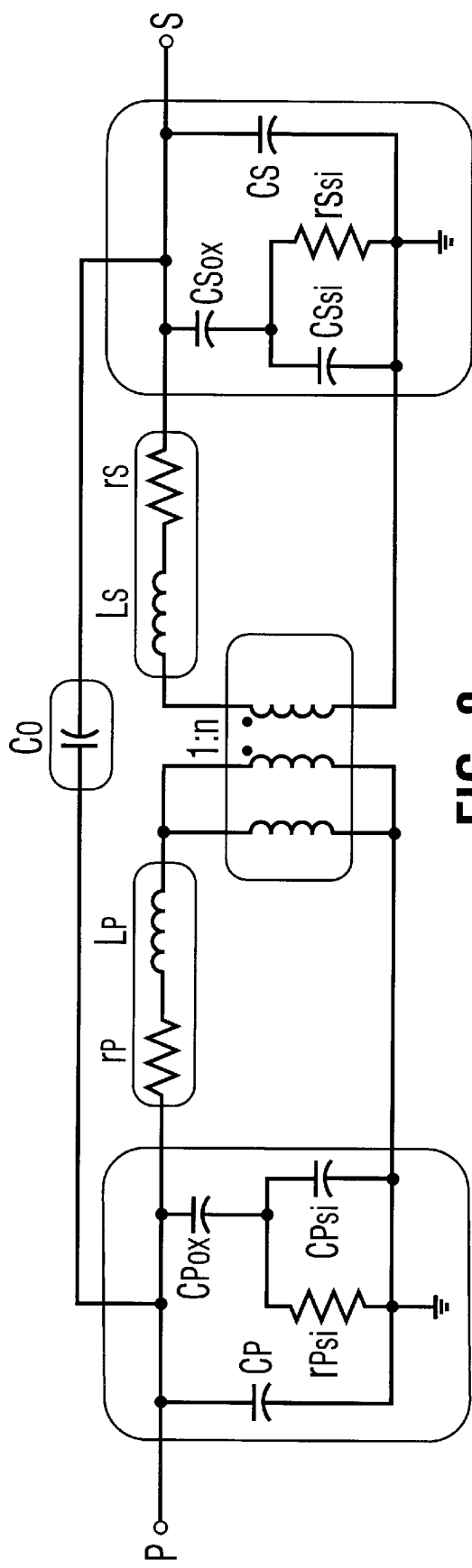
FIG. 8 is a schematic diagram of a compact circuit model of a monolithic microstrip transformer.

For design optimization, a simplified version of this lumped element model, i.e., a compact model, is then developed by simplifying this lumped element model, as is valid within a more restricted range of frequencies. An example of such a compact model for a transformer of turns ratio 1:n is shown in FIG. 8 which is a schematic diagram of a compact circuit model of a monolithic microstrip transformer. A compact model for a transformer balun is similar to the model shown in this drawing, but with two secondary output ports and a center-tapped secondary winding. A linear transformer with magnetizing inductance, Lm, forms the core of the model. Parasitic inductances Lp and Ls are placed in series with the primary and secondary windings of the linear transformer to account for non-ideal coupling (leakage) between the windings. Lumped resistors rp and rs are placed in series with the leakage inductances to represent losses in the metallization, and lumped capacitors are used to represent electrostatic coupling between the windings, as well as from each winding to the underlying substrate. The low frequency parameters of the compact model are easily determined from the corresponding low frequency parameters of the complete lumped-element model described previously. An estimate of the parasitic capacitances can also be obtained from the complete model, but optimization is required to refine the capacitive parasitic values and minimize the error between the electrical characteristics of the compact and complete lumped-element models. It should be noted that in the process of optimizing the compact model parameter values, their physical significance is lost.

From the simplified transformer circuit model shown in FIG. 8, it can be easily seen that the transformer will show a bandpass-type frequency response between the primary and secondary terminals. At frequencies well below the passband, little of the signal that is applied to the primary terminals can be coupled to the secondary winding. Therefore, the magnetizing inductance must be made large enough that the passband will occur within the desired frequency range, by proper selection of the transformer dimensions and the number of turns of metal. However, too large a structure introduces unwanted parasitic capacitances, which will limit the upper bandwidth. The linear transformer (shown at the center of the diagram in FIG. 8 has a permeability equal to that of free space, which implies high linearity and low frequency dependent losses in the core material. However, low core permeability does not tightly confine the magnetic field, so there is a less than perfect coupling between the primary and secondary windings of a monolithic transformer. This results in significant leakage inductances (Lp and Ls in FIG. 8), that place an upper limit on the bandwidth of the transformer.

If the feed-forward capacitance (Co) is neglected, the parasitic elements at the input and output of the linear transformer in FIG. 8 can be combined with the source and load impedances into a single impedance, for example Zs at the source. The linear transformer has a reasonably high coefficient of coupling (k is between 0.7 and 0.8 for the monolithic transformers here) so it can be assumed that the leakage inductances are relatively small. The impedance seen at the secondary terminals for the combined source impedance Zs as defined is then approximated by the following equation:

$$Zreflected = n^2 \cdot [j\omega(L_m) \| Z_S] \qquad (1)$$

The impedance reflected from the primary to the secondary (Zreflected in equation 1) is simply the parallel combination of the primary inductance and the combined source impedance multiplied by the square of the transformer turns ratio. Appropriate selection of the source reactance can then be used to modify the impedance reflected from the primary to the secondary. For example, a capacitance might be used to force a resonant condition between Zs and Lm. A real impedance can then be reflected to the secondary. Similar arguments apply for impedances reflected from the secondary back to the primary. This example shows how tuning of the transformer primary and secondary circuits can be used to reduce the effects of the transformer inductances and thus idealize the transformer behavior for frequencies close to resonance. The transformer bandwidth when tuned is still on the order of a few hundred MHz, which is more that adequate for prospective wireless applications.

Figure 10:
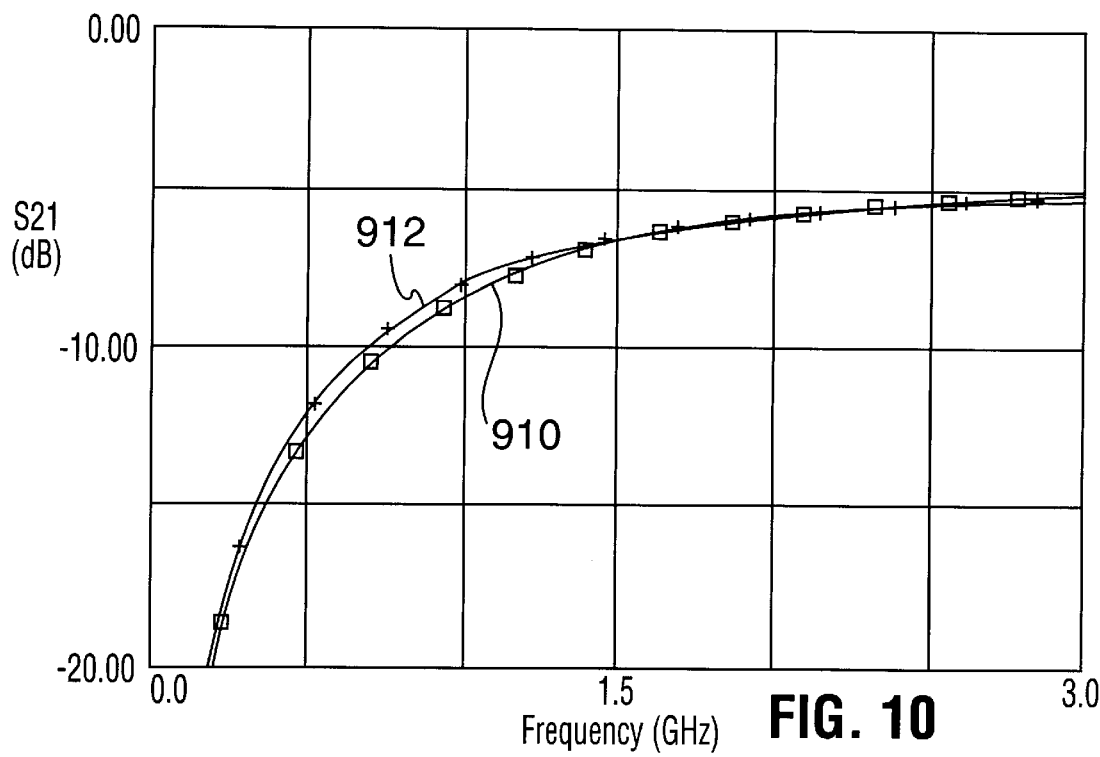
FIG. 10 shows measured and simulated forward transmission coefficients S21 in dB as a function of frequency for input to the inverting port for the balun.
Figure 11:
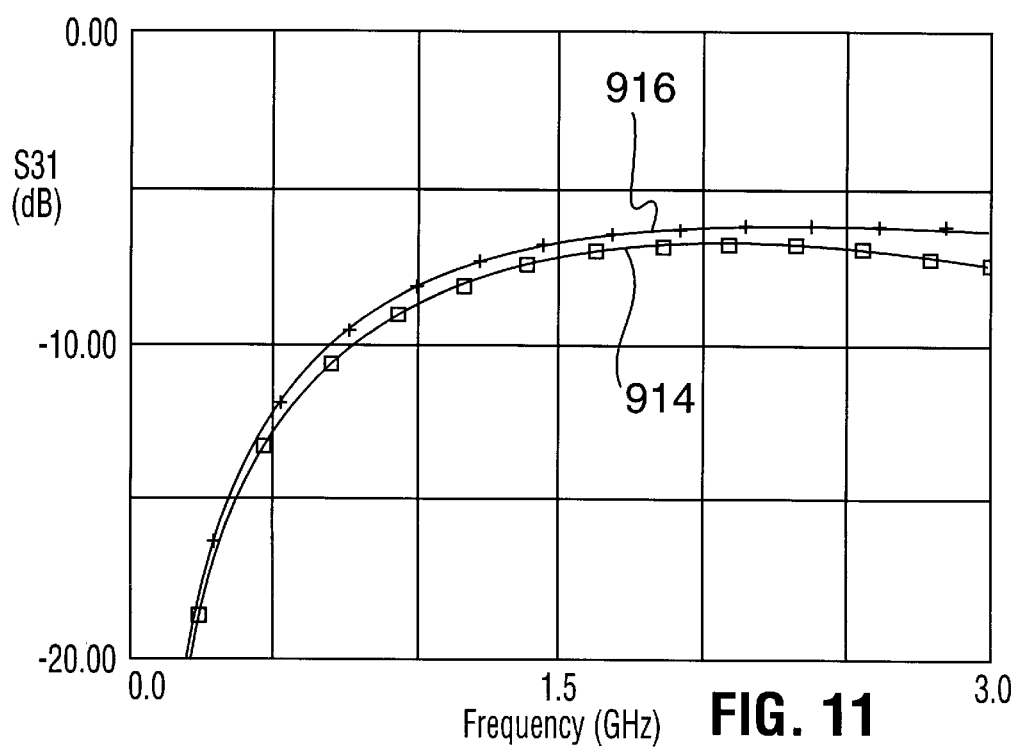
FIG. 11 shows measured and simulated forward transmission coefficients S31 in dB as a function of frequency for input to the non-inverting port for the balun.

The measured and simulated performance of the transformer balun designed for the double-balanced mixer is shown in FIG. 10. Curves 910 and 912 show the measured and simulated performance, respectively. The measured transmission coefficient (S21) from the primary input to the inverting secondary output is plotted for an on-wafer measurement, using a separate test structure designed specifically for this purpose. The simulation result shown is for a complete lumped element model, derived from the layout and substrate parameters as previously outlined. The performance predicted by the transformer model and the experimental measurements differ by less than 0.2 dB in the transformer passband. Excellent agreement has also been obtained for the primary to non-inverting secondary output response of the balun (FIG. 11). In FIG. 11, curves 914 and 916 show measured and simulated forward transmission coefficients S31 in dB, respectively.

The turns ratio of the monolithic transformer is set by the ratio of the secondary to the primary winding length and by the transformer linewidth and line spacing. The metal lines used in the transformer layout have dimensions on the order of microns. These dimensions are defined photolithographically to within one-tenth of a micron in a sub-micron IC process. Therefore, the coupling and the transformer turns ratio (i.e., self- and mutual-inductances) are virtually insensitive to variations in the fabrication process. Simulations predict that the tolerance on the self and mutual inductances of the transformers designed in the embodiment will be less than 3% for a ±0.2 $\mu$m change in the linewidth and linespacing. A larger and more subtle tolerance is introduced by variations in the intermetal dielectric oxide thickness and changes in substrate resistivity, which both affect the parasitic capacitances of the transformer structure.

However, simulations also predict that the variation in transformer bandwidth will be less than 5% for a ±1 $\mu$m change in oxide thickness and a ±50% change in substrate resistivity from the nominal BiCMOS process parameters listed in Table 1. These tolerances are far less than those encountered for other passive monolithic components, such as capacitors and resistors. A third source of variation is the temperature coefficient of resistance for the metallization used. Aluminium has a strong positive temperature coefficient of resistance (approximately 0.4%/° C) which can cause a large change in the metal losses with increasing temperature.

For monolithic inductors, this is a severe problem, because this shift in metal resistance will directly affect the component quality factor or Q. The effect on the performance of the transformer is not as severe, however, because the metal losses are in series with the terminal impedances present at the primary and secondary that are an order of magnitude larger.

V. RF Preamplifier

A schematic diagram of the low-noise RF preamplifier according to the embodiment is shown in FIG. 4.

High frequency amplifiers in a silicon integrated circuit technology have traditionally been designed as broadband circuits using resistors (R) and capacitors (C) as the sole passive circuit elements. However, a narrowband circuit topology which exploits the performance advantages offered by resonant tuning of inductive (L) and capacitive (C) elements has been chosen for this design.

The transformer 424 is connected so that negative feedback is applied by mutual inductive coupling from the amplifier output at the collector of the transistor 412 back to the emitter, to improve the linearity of the amplifier. Also, negative feedback will stabilize the amplifier gain as operating parameters such as temperature and supply voltage are varied. The common emitter connection has been chosen for the transistor 412 in order to maximize the gain and minimize the noise figure available from a single-stage amplifier (see G. D. Vendelin, A. M. Pavio and U. L. Rohde, "Microwave Circuit Design Using Linear and Non-linear Techniques", New York, N.Y.: Wiley, 1990, Chapter 4). For the embodiment, a preamplifier power gain of approximately 10 dB is chosen as a compromise between the overall receiver sensitivity and the input signal level which will overload the front-end circuitry.

The collector-emitter voltage across the transistor 412 is almost equal to the full supply voltage, VCC, because the resistive losses in the primary and secondary windings 422 and 432 of the transformer 424 are small. This allows the transistor 412 to operate in the forward-active mode for supply voltages as low as 0.9 volts. The transistor can be also be operated at a low bias current, since the bandlimiting effects of the device parasitic capacitances at the collector can be minimized by tuning the collector load to the desired frequency of operation. Thus, low voltage as well as low power operation of the preamplifier can be realized. In addition, power consumed at the input by active feedback and terminal impedance modification schemes is eliminated by using the passive LC matching network formed by the inductor 416 and the capacitor 420, which can be implemented with high quality-factor off-chip components.

The relative contribution of the transistor noise sources to the overall signal-to-noise ratio depends upon the source impedance seen at the transistor input terminal, and there is an optimum source impedance which will result in the lowest noise figure. In general, this optimum noise match is not equal to the conjugate of the transistor input impedance, which would be required for maximum power transfer.

An inductor can be placed in series with the emitter lead of the bipolar transistor to modify the noise match (S. Iversen, "The Effect of Feedback on Noise Figure", Proceedings of the IEEE, Vol. 63, pp.540–542, March 1975), and under certain conditions the minimum noise figure and the maximum power transfer at the input can be achieved simultaneously, making this approach very attractive. However, a large series inductor is required in practice, and therefore two stages of amplification would be needed to achieve a gain of 10 dB. This increases the circuit complexity and the power consumption. A second alternative is to select the matching components (the inductor 416 and the capacitor 420) at the amplifier input to strike a compromise between the amplifier noise figure and the quality of the input impedance matching. However, without a good impedance match between the antenna 110 and the input of the front-end preamplifier 116, additional components would be required for antenna-amplifier isolation, which increases receiver cost, size and weight. Therefore, a high quality impedance match is needed in order to transfer as much power from the antenna as possible without reflections. In this design, the input of the RF preamplifier is impedance matched to the source, and there is a slight increase in the noise figure as a result.

Dominant noise sources in this amplifier are thermally generated noise from the extrinsic base resistance of the transistor 412 and the shot noise generated by the flow of bias current in the collector. The collector load resistor 428 is used to match the impedance at the collector of the transistor 412 to the load. The resistor value needed to do this is relatively high, hence its thermal noise contribution is negligible because it appears at the amplifier output. Resonant tuning of the circuit adds some flexibility in the choice of the emitter area for the transistor 412 by resonating out stray capacitances, which is important when attempting to optimize the stage for the best possible noise figure.

The emitter area of the bipolar transistor for this RF preamplifier design is selected after evaluating both the gain and noise performance of the devices available in the BiCMOS technology. The maximum power gain that can be obtained from the transistor 412 must be sufficient to meet the gain specification of the RF preamplifier at the desired operating frequency and bias point. The dominant term in the noise figure for a common emitter amplifier is given by:

$$\text{Noise Figure} \propto gm \cdot rbb' \left(\frac{f}{f_T}\right)^2 \quad (2)$$

as shown by H. Fukui, in "The Noise Performance of Microwave Transistors", IEEE Transactions on Electron Devices, Vol. ED-13, pp.329–341, March 1966.

This is consistent with the dominant noise sources being collector current shot noise (since collector current density determines gm and fT) and the thermal noise generated by $r_{bb'}$. At a given frequency, temperature and bias current, only $r_{bb'}$ and fT in equation 2 will vary with emitter area. Thus, the device emitter area can be increased in order to reduce $r_{bb'}$ until the collector current shot noise causes an unacceptable degradation of the noise figure because of a reduction in the transistor $f_T$.

The effect of the number of emitter stripes used in the device design was also investigated. The extrinsic base resistance for a given emitter area can be reduced by using a large number of transistors with short emitter stripes connected in parallel. This is commonly done in low frequency designs, where a much larger base area will be used in order to minimize rbb' at the expense of increased collector-base capacitance (D. F. Bowers, "Minimizing Noise in Analog Bipolar Circuit Design", Proceedings of the Bipolar and BiCMOS Circuits and Technology Meeting, Minneapolis, 1989, pp. 107–111). However, it was found in this case that multiples of the longest possible emitter stripe produced the best noise performance at a 2 mA bias current. This optimum is rather broad and is not critically dependent on the number of emitter stripes used or the total emitter area. The emitter area selected for the transistor 412 is 0.8×120 $\mu m^2$.

Stability is an important issue in feedback amplifier design, especially at radio frequencies. The RF preamplifier must be stable for input and output terminations that are drastically different from the intended 50 Ω source and load impedances (such as an open circuit) and it must be stable in all frequency bands. The bipolar transistor is potentially unstable at low frequencies when the power gain is large, and hence resistive damping is often added to the matching networks to dampen oscillations, even in single-stage amplifiers. This is undesirable because resistive losses increase the thermal noise level. The transformer feedback network used in this design bandlimits the low and high frequency ranges of the response, ensuring that the amplifier will be absolutely stable even when lossless matching networks are used. Computer simulations predict absolute stability for this design in all frequency bands (i.e., Rollett's stability factor>1), and no oscillatory tendencies have been noted in practice.

The maximum power gain is realized when the input and output of the RF preamplifier are impedance matched to the source and load. The power gain of the low-noise amplifier (when properly matched) can be approximated by the following equation, assuming the simplified bipolar transistor model (see FIG. 9) and ideal voltage and current relationships for the transformer (i.e., perfect coupling):

$$\text{Power Gain} = \quad (3)$$

$$|S_{21}|^2 = \left| \frac{-gmZ_L}{A_{BJT} + gmZ_L\left[\frac{1}{n} + j\omega bb'C_\mu\left(\frac{1}{n}+1\right) - \omega^2 L_{in}C_\mu\left(\frac{1}{n}+1\right)\right]} \right|^2$$

where $$A_{BJT} = 1 + j\omega rbb'(C_\pi + C_\mu) - \omega^2 L_{in}(C_\pi + C_\mu) \quad (4)$$

and Lin is the total inductance at the amplifier input (i.e., Li in series with Lbond in FIG. 4). At low frequencies, the effects of the transistor capacitances can be ignored and equation 3 can be approximated by:

$$|S_{21}|^2 \sim \left| \frac{-gmZ_L}{1 + gmZ_L\left(\frac{1}{n}\right)} \right|^2 \quad (5)$$

If the product of the transconductance and the load impedance (gmZL) is large, then equation 5 predicts that the low frequency power gain of the amplifier is equal to the square of the turns ratio (n). Tuning of the amplifier input can be used to achieve the same effect at RF, because of two resonances present in equation 3. The first is the series resonance at the input, which is described by equation 4, and the second is the effect of the feedforward path due to the collector-base capacitance (Cm) combined with the transformer feedback path. If the total inductance at the input (Lin) is resonated with capacitances Cp and Cm, then the magnitude of ABJT (as given by equation 4) becomes negligible compared to the other terms in the denominator of the power gain relationship. For small values of the base resistance and collector-base feedback capacitance, the $C\mu$ dependent components in the second term in the denominator can be neglected, and the power gain of the RF preamplifier again reduces to the square of the transformer turns ratio. Thus, a transformer turns ratio of 4 should produce a power gain of 12 dB.

Under the previous assumptions, the 1:4 step-up transformer (the transformer 424 in FIG. 4) will set the power gain of the amplifier if the transconductance and/or the load impedance are large. However, the bipolar transistor transconductance is small when the amplifier is operated at a low bias current and the load impedance is also small (on the order of 50 Ω), hence the power gain of the RF preamplifier is not simply $n^2$. Non-idealities present in monolithic transformers, such as non-ideal coupling between primary and secondary and feedforward parasitics (e.g., Co in FIG. 8) will modify the power gain.

Figure 9:
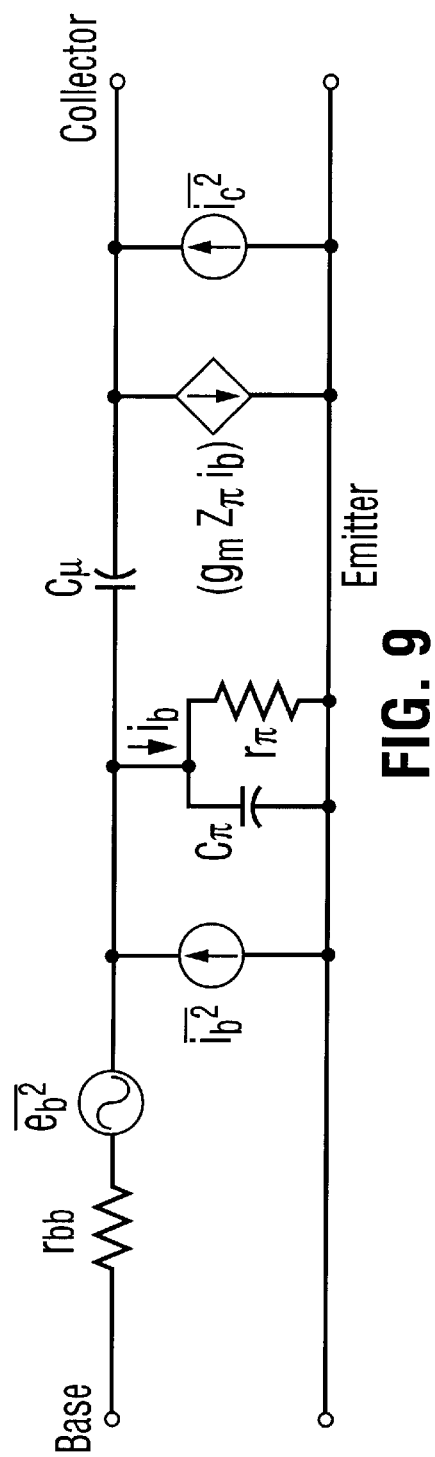
FIG. 9 is a schematic diagram of a simplified small signal model of a bipolar transistor at high frequency.
Figure 12:
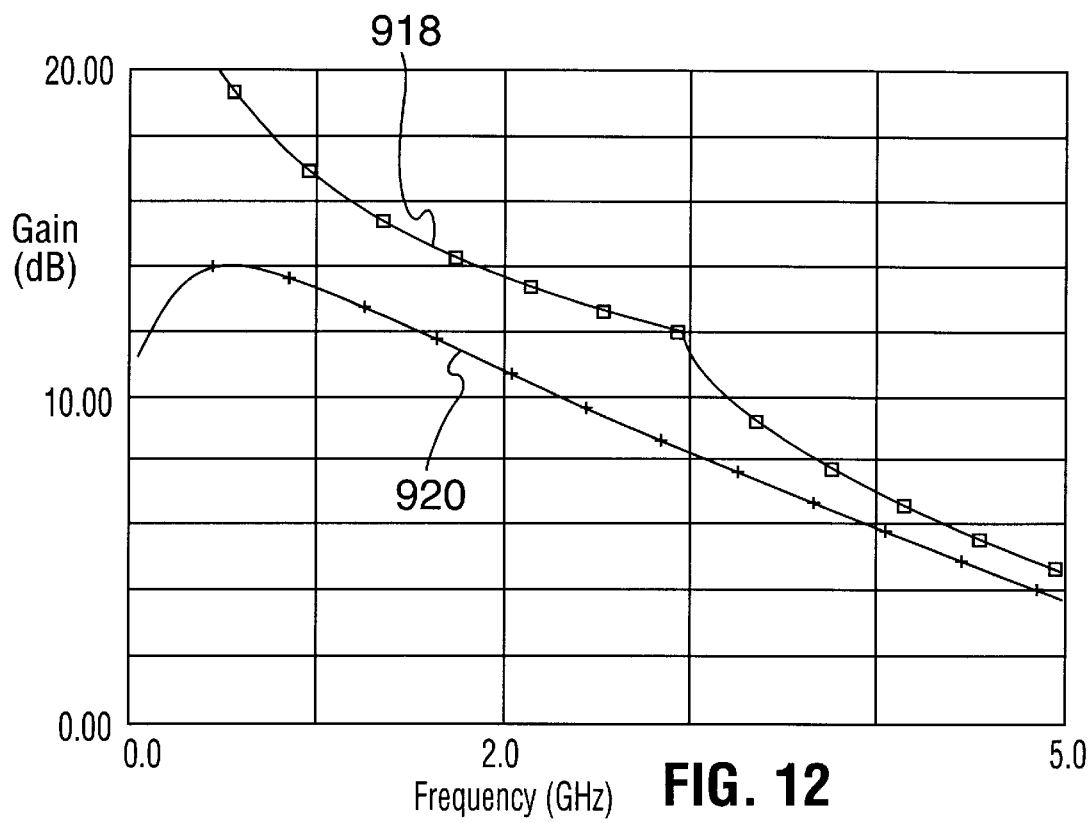
FIG. 12 shows a maximum available gain for the RF preamplifier and the bipolar transistor.
Figure 13:
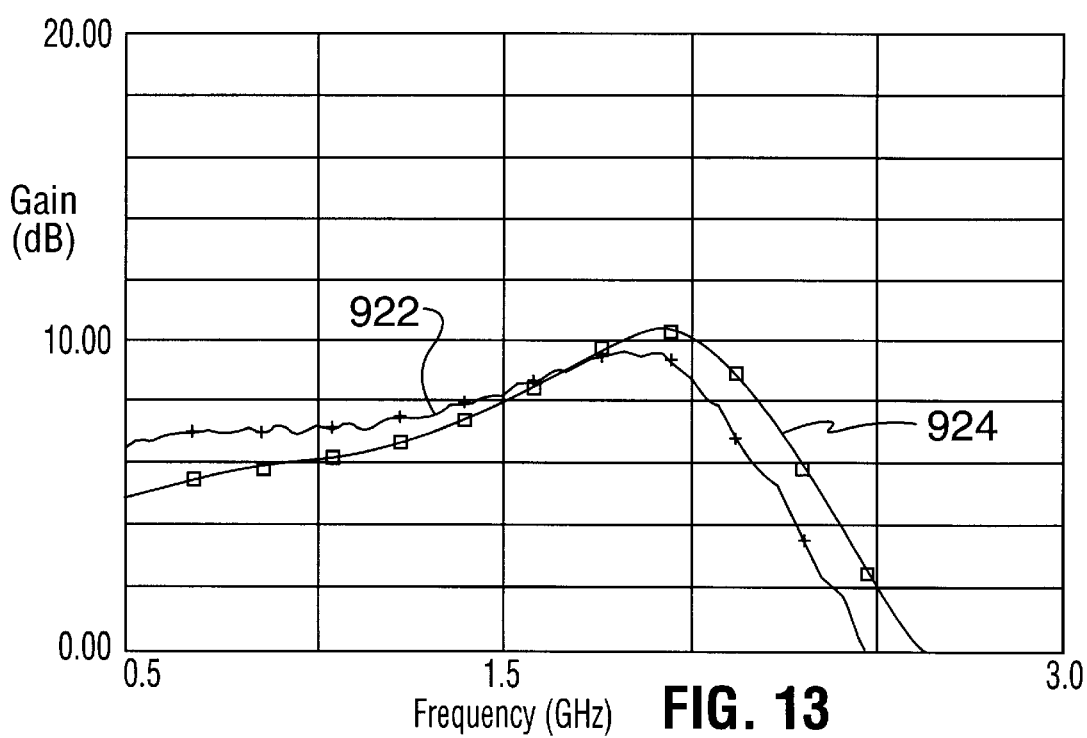
FIG. 13 shows the measured and simulated frequency response of the RF preamplifier according the embodiment.

In addition, the simplified high frequency equivalent circuit in FIG. 9 does not completely account for the bipolar transistor gain roll-off with frequency. Therefore, it is useful to compare the power gain of the bipolar transistor alone to the power gain that can be obtained from the complete the RF preamplifier, in order to evaluate the true effect of the transformer feedback. The frequency dependence of the maximum stable power gain for a bipolar transistor connected in common emitter configuration without transformer feedback is illustrated in FIG. 12. In FIG. 12, curves 918 and 920 show frequency—gain characteristics of the bipolar transistor and the RF preamplifier, respectively. The bipolar transistor bias conditions used to derive these results are identical to those used for the RF preamplifier (VCE=1.9 volts, IC=2 mA). Below 3 GHz, the bipolar transistor is potentially unstable, and so the highest power gain that can be achieved without an oscillation occurring is plotted in this frequency range. Above 3 GHz, the device is absolutely stable and there is a discontinuity in the slope of the bipolar transistor gain curve at the transition point between the conditionally and unconditionally stable regions. The power gain of the RF preamplifier is also plotted in FIG. 13 for comparison, using an identical bipolar transistor biased under the same conditions, but connected to a 1:4 turns ratio transformer as in FIG. 4. In FIG. 13, curves 922 and 924 show the measured and simulated frequency response of the RF preamplifier. The preamplifier is absolutely stable for all operating frequencies, consequently the power gain curve shown for the RF preamplifier is the maximum gain available from the amplifier. Thus, transformer feedback achieves the desired effect; it stabilizes the amplifier and levels the power gain available from the bipolar transistor, at the expense of some gain reduction as would be expected with negative feedback.

Considering the input impedance of the amplifier, an analysis similar to equation 3 shows that the feedback from the output through the transformer has a relatively small effect. The output impedance is, however, strongly affected by the transformer feedback. The output impedance of a bipolar transistor without feedback has a large real component due to the small output conductance of the device. Application of negative feedback lowers the output impedance so that an additional matching network is not necessary at the output, which simplifies the overall design of the RF preamplifier.

The amplifier bias supply shown in FIG. 4 ($V_{BB}$) is not included on the prototype front-end testchip and off-chip biasing is used. However, circuits which could be used to implement this bias source on-chip can be found in the existing literature (A. Grebene, "Bipolar and MOS Analog Integrated Circuit Design", New York, N.Y.: Wiley, 1984, Chapters 4 and 9; and R. G. Meyer and W. D. Mack, "A 1-GHz BiCMOS RF Front-end IC", IEEE Journal of Solid-State Circuits, Vol. 29, No. 3, pp. 350–355, March 1994). The transconductance of the bipolar transistor must be kept constant with variations in both the supply voltage and ambient temperature, because the small-signal characteristics of the device are sensitive to changes in the collector bias current. One method of achieving this was presented by E. Heaney, F. McGrath, P. O'Sullivan and C. Kermarrec, in "Ultra Low Power Low Noise Amplifiers for Wireless Communications", Proceedings of the GaAs IC Symposium, San Jose, Calif., pp. 49–51, October, 1993.

VI. Double-Balanced Mixer

In general, optimum mixer performance can be expected from a balanced as opposed to a single-ended circuit topology (S. A. Maas, "Microwave Mixers", Norwood, Mass.: Artech House, 1993, Chapter 4).

In FIG. 5 which shows the schematic diagram of the double-balanced mixer according to the embodiment of the present invention, the RF input signal is split into anti-phase and in-phase components by the balun 513 and is then fed to the cross-coupled switching quad of transistors 520, 522, 524 and 526. Bias current is fed from a current source transistor 540 to the switching quad through the center-tap in the secondary windings 516 and 518 of the balun 513. The signal current is chopped by the transistor quad at the local oscillator (LO) rate in order to down-convert the input signal RFin fed from the input terminal 514 to the desired intermediate frequency (IF). The down-converted RF input signal is buffered to a 50 Ω load using the on-chip Darlington buffer (the transistors 564 and 566), or alternately, the IF output can be impedance matched using an external matching network (e.g., the winding 558 of the balun 553 shown in FIG. 5). The input from the local oscillator (not shown) is terminated on-chip by the resistor 532.

The double-balanced connection will cancel even-order spurious components at the IF output. This is important in a monolithic mixer implementation, where spurious signals can interfere with other circuits integrated on the same IC, through parasitic coupling paths. The local oscillator signal (LO) is normally much larger than either the RF or the IF signals, and thus high isolation is necessary between the LO inputs and the other ports to prevent the local oscillator signal from leaking back to the antenna, or overloading the IF circuitry. The LO and IF ports are isolated by the symmetric connection of transistors 520, 522, 524, 526, and matching of these devices in a monolithic context allows an LO-IF isolation of greater than 40 dB to be achieved in practice. The LO and RF ports are isolated by the balun 513 and thus symmetry in the balun response between the inverting and non-inverting ports is necessary to achieve good LO-RF isolation.

The balun 513 is tuned by the capacitors placed in parallel with the primary winding 512 and the secondary windings 516 and 518, as per equation 1. When properly tuned, the source at RF and its associated impedance will appear as a resistor and a voltage source in series at the secondary terminals. The load impedances seen by the two sides of the transformer secondary are the emitters of the switching quad. They can be modeled as an inductor in series with a resistor. The inductive reactance can be absorbed into the tuning network at the balun secondary, and consequently, only the real portion of this impedance must be matched to the transformed signal source. When this is done, the large-signal emitter resistance defines the transformer load. The emitter resistance depends upon the bias current (via the transistor 540) and the signal amplitude at the LO input to the mixer.

At a bias current of 2.5 mA, the load at the balun secondary is almost 50 Ω (resistive) when the LO port of the mixer is driven by a large amplitude sinusoid (−3 dBm input power). This impedance cannot be matched with a 1:1 turns ratio balun because the resistive losses of the transformer windings must be added to the primary and secondary impedances. Modifying the transformer turns ratio to a 4:5 step-up achieved the desired match without altering the bias current.

The source impedance as seen by each pair of transistors in the switching quad (transistors 52–526), $r_{SRC}$, can be approximated by the following equation:

$$r_{SRC} = \frac{n^2 \cdot 50 + r_{T1}}{2} \quad (6)$$

where 1:n is the balun turns ratio and $r_{T1}$ represents the resistive losses of the transformer windings. Ideal behaviour of the transformer can be assumed here because the balun primary and secondary are resonant tuned. The LO inputs of the switching quad are driven with a large amplitude signal, and therefore two of the transistors in the quad are biased in the active region, and the other transistors in the quad are cut-off for a large portion of each cycle (e.g., the transistors 520 and 524 "on" and the transistors 522 and 526 are cut-off as in FIG. 5, when LO+ is much larger than LO−). The transistors biased in the active mode operate in the common base configuration and amplify each phase of the received signal to the intermediate frequency output. The transformed source resistance ($r_{SRC}$) degenerates the common base amplifier and extends its linear range of operation. The balun 513 has been used to advantage here to match the source impedance to the mixer and improve the mixer linearity without causing a significant increase in the overall noise figure. This is because no additional dissipation has been added to the circuit other than the losses in the transformer windings, which are relatively small. Linearization of conventional IC mixers, such as the Gilbert-type balanced demodulator, requires the addition of degeneration resistance, which causes a large degradation in the mixer noise figure when high linearity is desired.

The noise introduced by the mixing process is difficult to determine analytically (D. N. Held and A. R. Kerr, "Conversion Loss and Noise of Microwave and Millimeter-wave Mixers: Part 1—Theory", IEEE Transactions on Microwave Theory and Techniques, Vol. MTT-26, pp. 49, February 1978).

The balun introduces some loss at the mixer input because of dissipation in the windings, but this decrease in the signal-to-noise ratio can be easily computed from linear network theory. However, the non-linearity caused by large-signal operation of the switching quad cannot be treated in a simple way. When the quad is switched hard in either direction, only two of the transistors are active and the circuit is operating in a common base amplifier configuration. The RF signal coupled to the quad by the balun 513 is amplified to the collector load at the IF outputs. There is some degradation caused by the dominant transistor noise sources of the common base amplifier, which are collector current shot noise and thermally generated noise from the extrinsic base resistance.

Operating the mixer at a low bias current reduces the shot noise contributed by each active device, however, the switching speed of the transistors in the quad is also important to lowering the noise figure. When the LO inputs are close to the same potential, very little of the signal at the mixer RF input appears at the IF output, because of the balanced circuit connection. All four transistors 520–526 in the quad are forward biased in this condition and contribute noise to the IF output. Thus, the signal-to-noise ratio is very low during the switching interval, and fast switching of the transistor quad is needed to reduce this portion of each LO cycle. Switching speed is not the only consideration, because of the trade-off between emitter area and the extrinsic base resistance of the bipolar transistor. Careful selection of the emitter area for the transistors in the switching quad is therefore required in order to achieve a good mixer noise figure. A compromise is needed between a small transistor which can switch quickly between states and a larger transistor with less thermally generated noise from the transistor $r_{bb}'$.

The non-linear noise analysis capability of a harmonic balance simulator (Hewlett-Packard's MDS simulator) was used to compute the mixer noise figure. From these simulations, it was confirmed that collector current shot noise and thermally generated noise from the transistor extrinsic base resistance were the dominant source of noise. The relationship between the local-oscillator input signal level and the noise figure was also investigated, and a transistor emitter area for transistors 520–526 shown in FIG. 5 was selected which resulted in a simulated noise figure of 10.5 dB (single-sideband). Simulations also predict that the on-chip termination resistor 532, increases the noise figure of the mixer by approximately 1 dB, and hence the noise figure could be improved by either integrating the LO source on the same chip as the mixer, or by using a reactive matching network at the LO input.

Thus, a 1.9 GHz low-noise preamplifier (RF preamplifier) and double-balanced mixer that have been fabricated in a mature silicon BiCMOS process are described herein. A production silicon technology offers the advantages of low fabrication cost as well as the potential for a high level of circuit integration. Monolithic transformers fabricated using coupled microstrip lines have been implemented to lower the operating voltage and the current consumed by both the receiver preamplifier and mixer. In addition to allowing a lower operating voltage, the transformer in the RF preamplifier is used as a low loss feedback element, that has been exploited to achieve a low noise figure in the preamplifier, while maintaining the benefit of negative feedback to linearize the stage. Also, a monolithic transformer balun is used to efficiently couple the single-ended input signal from the RF preamplifier to a low power double-balanced mixer, and thereby realize a low level of harmonic distortion and a good signal-to-noise ratio.

VII. Circuit Layout

Figure 14:
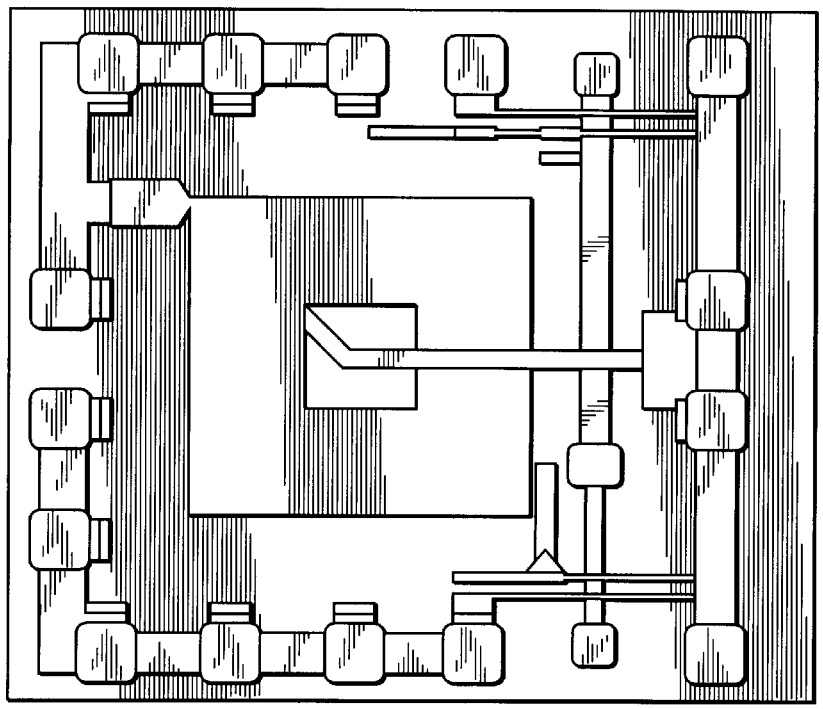
FIG. 14 shows a photomicrograph of the RF preamplifier.
Figure 15:
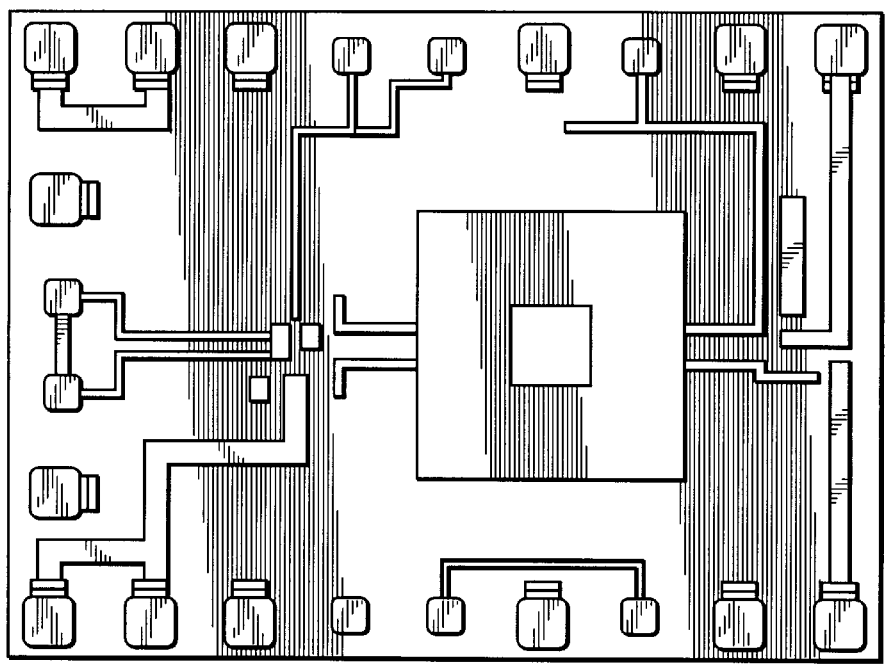
FIG. 15 shows a photomicrograph of the double-balanced mixer

Photomicrographs of the low-noise preamplifier and double-balanced mixer test circuits are shown in FIGS. 14 and 15, respectively. The transformers for both the mixer and the preamplifier are fabricated using aluminium metal 1 $\mu$m thick, with a linewidth of 15 $\mu$m and a line-spacing of 1.8 $\mu$m. The inverting step-up transformer designed for the RF preamplifier consists of a total of 8 turns and measures 400 $\mu$m on each side. The secondary winding is a continuous 4 turn spiral and the primary winding consists of 4 single-turns connected in parallel, resulting in the desired 1:4 transformer turns ratio. The active area required by the amplifier is 0.65×0.55 mm².

The design of the balun can be clearly seen in the photomicrograph of the complete mixer shown in FIG. 15. The balun consists of 9 turns of top level metal and measures 425 $\mu$m on each side. The balun is symmetrically wound so that the center-tap can be precisely located and the losses in both halves of the secondary winding equalized. Primary and secondary microstrip lines are interleaved to maximize mutual coupling between the windings and each half-turn is interconnected along the horizontal line of symmetry that runs across the center of the testchip. The mixer has an active area circuit area of 0.85×0.65 mm². The pad configuration used for both the RF preamplifier and mixer testchips was chosen to facilitate both on-wafer characterization using coaxial microwave probes and wirebonding of the ICs into a package.

VIII. Experimental Results

The measured and simulated performance of the RF preamplifier is summarized in Table 3. These experimental measurements were obtained from a packaged device biased at a supply voltage of 1.9 volts and a bias current of 2 mA.

A noise figure of 2.8 dB was measured for the silicon RF preamplifier. A 3.5 nH series inductor (L__) and a 2.5 pF shunt capacitor (Ci) were connected at the amplifier input as shown in FIG. 4 to achieve a good 50 Ω input match (VSWR of 1.2). The minimum noise figure of 2.1 dB was determined from on-wafer measurements of the amplifier using the ATN NP-5 noise measurement system. This data indicates that the noise figure of the amplifier could be further reduced at the expense of the quality of the input impedance match (i.e., higher VSWR) if desired. No attempt was made to impedance match the output of the RF preamplifier, however, an acceptable VSWR of 1.4 was achieved with the packaged device.

The third-order intercept point (IP3) characterizes the level of third harmonic distortion generated by the RF preamplifier. This transformer-coupled amplifier achieves a high input intercept for the chosen bias current. Harmonic distortion is generated by the non-linear capacitances of the bipolar transistor and by the non-linear (exponential) relationship between the collector current and the base-emitter voltage (i.e., the diode non-linearity). Distortion produced by the diode non-linearity will be higher here because a low dc collector current is used. In addition, the bipolar transistor when operated at a low bias current has large parasitic capacitances and can therefore generate significant amounts of harmonic distortion, even at low input power levels. A transistor with the same emitter area as that used in the RF preamplifier here and operated under identical bias conditions was found to have an input third-order-intercept point of −11 dBm. Thus, a 8 dB improvement in the input intercept point of the device is achieved through the use of transformer-coupled feedback in this amplifier configuration.

The bandpass shape of the RF preamplifier frequency response is the result of resonant tuning the input matching network. The peak gain of 9.5 dB was obtained from the packaged device at a frequency of 1.9 GHz (see curve 922 in FIG. 13). There are slight differences between the experimental measurement and the simulated curves, which can be attributed to tolerances in the input matching network components and losses introduced by the package and test fixture. The power supply decoupling network causes the measured gain to increase at lower frequencies, where the quality of the ac ground at the transformer secondary is poor.

The amplifier isolation measured for the packaged device is 10 dB lower than predicted by the computer simulation, which was expected. This is because parasitic coupling within the package and the test fixture was not included, and there is a significant amount of mutual coupling (both capacitive and inductive) between package leads and bondwires. However, the measured isolation is adequate for wireless receiver applications.

The specifications for two recently reported 1.9 GHz GaAs RF preamplifiers are shown in the left column of the Table 3 for comparison. The silicon bipolar RF preamplifier outperforms the 0.5 μm GaAs FET preamplifier in all reported specifications except power gain, as reported by T. Ohgihara, S. Kusunoki, M. Wada and Y. Murakami, "GaAs Front-end MMICs for L-band Personal Communications", IEEE 1993 Microwave and Millimeter-Wave Monolithic Circuits Symposium Technical Digest, Atlanta, Ga., pp. 9–12, June, 1993. The RF preamplifier fabricated in the fine-line E/D MESFET process demonstrated the best combined noise figure, gain and power consumption specifications as of its publication date: M. Nakatsugawa, Y. Yamaguchi and M. Muraguchi, "An L-band Ultra Low Power Consumption Monolithic Low Noise Amplifier", Proceedings of the GaAs IC Symposium, San Jose, Calif., pp. 45–48, October, 1993. This GaAs IC has approximately 2.5 dB more gain at one-half the supply current of the silicon RF preamplifier developed as an embodiment of the present invention. The GaAs amplifier input intercept point (IP3) is 4 dB lower than the silicon RF preamplifier, in part because a small bias current was chosen for the design. However, the quality of the input and output matching of the GaAs amplifier is poor (i.e., a high VSWR), and it should be noted that the process used to fabricate the E/D MESFET amplifier is considerable more sophisticated and costly than a near-micron silicon BiCMOS technology (T. Enoki et al, "0.3 μm Advanced SAINT FET's Having Asymmetric N+-layers for Ultra High Frequency GaAs MMIC's", IEEE Transactions on Electron Devices, Vol. ED-35, pp.18–24, Jan. 1988).

The measured performance of the double-balanced mixer is summarized in Table 4. The mixer was packaged and tested at a supply voltage of 1.9 volts and bias current of 2.5 mA. An input power of −5 dBm was used to drive the local oscillator input, giving a single sideband noise figure of 10.9 dB in a 50 Ω system (i.e., with no additional noise matching network). A very low input VSWR of 1.17 was achieved without additional matching components.

Recently reported results for a low-power 1.9 GHz monolithic mixer fabricated in a 0.5 μm GaAs technology are also listed in Table 4 for comparison (T. Ohgihara, S. Kusunoki, M. Wada and Y. Murakami, "GaAs Front-end MMICs for L-band Personal Communications", IEEE 1993 Microwave and Millimeter-Wave Monolithic Circuits Symposium Technical Digest, Atlanta, Ga., pp. 9–12, June, 1993). A 3 V power supply is required by the cascaded transistors of the GaAs mixer and hence that circuit dissipates more power. The noise figure and linearity of the silicon bipolar mixer (indicated by the high third-order intercept point, or IP3 at the input) are comparable to the results demonstrated for the GaAs design. The double-balanced configuration used for the silicon mixer, when compared to the single-balanced GaAs design, resulted in a clearly superior LO-RF and LO-IF port isolation of 32 dB and 47 dB, respectively. High LO-IF isolation is desired in order to suppress spurious frequency components at the mixer IF output in a monolithic receiver implementation and LO-RF isolation is necessary to prevent the LO signal from leaking back to the antenna. The LO-RF isolation of the silicon mixer, while more than adequate, is degraded by parasitic signal paths that exist on-chip, within the IC package, and on the test fixture, and these signal paths were not accounted for in the simulation. Good agreement between measurement and simulation for all other specifications was obtained from both harmonic balance (Libra) and time-domain (SPICE) circuit simulators.

IX. Summary of the Embodiment

Monolithic transformers fabricated using coupled microstrip lines have been used in the embodiments to further the design art of low power RF wireless receiver circuits in silicon IC technology for applications in the 1 to 3 GHz range. Performance specifications comparable to some recently reported results in GaAs technology were realized through the use of transformers implemented in a submicron production BiCMOS process with standard process metallization. In addition to allowing an operating voltage below 2 volts at 1.9 GHz, the monolithic transformer has been exploited as a low-loss feedback element to achieve a receiver preamplifier noise figure of 2.8 dB. The benefit of negative feedback was used to raise the amplifier input intercept to −3 dBm. A monolithic transformer balun has been used to efficiently couple the single-ended input signal from the preamplifier to a double-balanced mixer, thereby realizing a +3 dBm input intercept point and a 10.9 dB single-sideband noise figure at a low bias current. The power dissipation for the entire receiver front-end is less than 9 mW, which is a direct consequence of the efficiency offered by narrowband design methods.

X. Alternatives

Although particular embodiments of the present invention have been described in detail, it should be appreciated that numerous variations, modifications, and adaptations may be made without departing from the scope of the present invention as defined in the claims. For instance, other semiconductor technologies may be used for fabrication of transistors, transformers and other circuit components: e.g., GaAs HBTs (heterojunction bipolar transistors).

TABLE 1

Microstrip Line Parameters

| Microstrip Line Parameter | Value |
|---|---|
| Substrate resistivity | 10 Ω-cm |
| Substrate (Si) thickness, b2 | 380 μm |
| Sub. dielectric constant | 11.7 |
| Oxide (SiO$_2$) thickness, b1 | 5 μm |
| Oxide dielectric constant | 3.9 |
| Top metal resistivity | 0.03 Ω-μm |

TABLE 2

Bipolar Transistor Parameters

| Parameter A$_E$ = 0.8 × 4.0 μm$^2$) | Value |
|---|---|
| Base-emitter capacitance, C$_{JEO}$ | 15 fF |
| Base-collector capacitance, C$_{JCO}$ | 21 fF |
| Collector-sub. capacitance, C$_{JSO}$ | 40 fF |
| Extrinsic base resistance, r$_{bb'}$ | 290 Ω |
| Transit frequency, f$_T$ | 11 GHz |
| Max oscillation frequency, f$_{MAX}$ | 13 GHz |

TABLE 3

RF Preamplifier Performance Summary

| RF Preamplifier | 0.3 μm GaAs E/D MESFET | 0.5 μm GaAs-FET | Measured 0.8 μm Si-Bipolar | Simulated 0.8 μm Si-Bipolar |
|---|---|---|---|---|
| Supply Voltage | 2.0 V | 3.0 V | 4.9 V | 1.9 V |
| Supply Current | 1.0 mA | 4.0 mA | 2.0 mA | 2.0 mA |
| Frequency | 1.9 GHz | 1.9 GHz | 1.9 GHz | 1.9 GHz |
| Noise Fig. (50 Ω) | — | 2.8 dB | 2.8 dB | 2.9 dB |
| Min. Noise Figure | 2.0 dB | — | 2.4 dB | 1.9 dB |
| Gain | 12.2 dB | 18.1 dB | 9.5 dB | 10.5 dB |
| IP3 (input) | −7.1 dBm | −11.1 dBm | −3 dBm | −3.5 dBm |
| Input VSWR | 1.36 | 1.5 | 1.2 | 1.15 |
| Output VSWR | 1.77 | 3.1 | 1.4 | 1.03 |
| Isolation | — | 21 dB | 21 dB | 30 dB |

TABLE 4

Double-Balanced Mixer Performance Summary

| Mixer | 0.5 μm GaAs-FET | Measured 0.8 μm Si-Bipolar | Simulated 0.8 μm Si-Bipolar |
|---|---|---|---|
| Supply Voltage | 3.0 V | 1.9 V | 1.9 V |
| Supply Current | 4.0 mA | 2.5 mA | 2.5 mA |
| RF Frequency | 1.9 GHz | 1.9 GHz | 1.9 GHz |
| LO Frequency | 1.66 GHz | 1.8 GHz | 1.8 GHz |
| SSB NF (50 Ω) | 10.8 dB | 10.9 dB | 10.5 dB |
| Conversion Gain | 5.7 dB | 6.1 dB | 6.3 dB |
| IP3 (input) | 2.3 dBm | 2.3 dBm | 1.1 dBm |
| RF Port VSWR | 1.2 | 1.17 | 1.15 |
| LO-RF Isolation | 13 dB | 32 dB | 80 dB |
| LO-IF Isolation | 5 dB | 47 dB | 52 dB |

What is claimed is:

1. An RF (radio frequency) amplifier fabricated on a silicon monolithic integrated circuit, the amplifier comprising:

a transformer having first and second windings which are microstrip inductor elements provided by a layer of metallization on top of a dielectric layer formed on a low resistivity silicon substrate, the first and second windings being mutually and inductively coupled with each other, the microstrip inductor elements being isolated from the silicon substrate by the dielectric layer;

a transistor formed in the low resistivity silicon substrate, the transistor having a base, a collector and an emitter, first and second voltages being supplied via the first and second windings of the transformer to the emitter and collector of the transistor, respectively;

input means for coupling an RF input signal to the base of the transistor; and output means for providing an amplified output signal from the collector of the transistor.

2. The RF amplifier of claim 1, wherein the input means comprises a first inductive element for coupling the RF input signal to the base of the transistor.

3. The RF amplifier of claim 2, wherein the input means further comprises an capacitive element which is connected across the first inductive element and the first winding of the transformer.

4. The RF amplifier of claim 1, wherein with the mutually inductive coupling of the first and second windings of the transformer, negative feedback is applied from the collector to the emitter of the transistor, the amplifier gain depending upon the turns ratio of the first and second windings.

5. The RF amplifier of claim 1, wherein the output means comprises a second inductive element for coupling the amplified output signal to an output circuit.

6. The RF amplifier of claim 5, wherein the output circuit includes an output impedance matching element.

7. The RF amplifier of claim 1, further comprising a capacitive element which is coupled in parallel with the second winding of the transformer to form a resonant circuit.

8. The RF amplifier of claim 7, further comprising a resistive element which is coupled in parallel with the capacitive element and the second winding of the transformer.

9. The RF amplifier of claim 1, wherein the first and second voltages are the ground terminal voltage and a positive voltage, respectively.

10. The RF amplifier of claim 1, wherein the dielectric layer is a silicon dioxide layer.

11. An RF mixer fabricated on a silicon monolithic integrated circuit, the mixer comprising:

a first differential transistor pair including first and second transistors formed in a low resistivity silicon substrate, each transistor having a base, a collector and an emitter, the emitters of the first and second transistors being coupled to each other;

a second differential transistor pair including third and fourth transistors formed in the low resistivity silicon substrate, each transistor having a base, a collector and an emitter, the emitters of the third and fourth transistors being coupled to each other, the collectors of the third and fourth transistors being coupled to the collectors of the first and second transistors, respectively, the bases of the third and fourth transistors being coupled to the bases of the second and first transistors, respectively;

means for coupling a local oscillation signal between the bases of the first and second transistors and between the bases of the fourth and third transistors;

a first transformer of a balun type having primary and secondary windings which are microstrip inductor elements provided by a layer of metallization on top of a dielectric layer formed on the low resistivity silicon substrate, the microstrip inductor elements being isolated from the silicon substrate by the dielectric layer, the secondary winding being divided to two winding sections, the two winding sections of the secondary winding being connected in series between the coupled emitters of the first and second differential transistor pairs;

current means coupled to the junction of the two divided winding sections of the secondary winding of the first transformer; and means for coupling a single-ended RF input signal across the primary winding of the first transformer, thereby a balanced signal being provided across the secondary winding of the first transformer in response to the RF input signal.

12. The RF mixer of claim 11, wherein the current means includes a fifth transistor having a base, a collector and an emitter, the collector being connected to the junction of the two divided winding sections of the secondary winding of the first transformer, the collector current being controlled by a voltage fed to the base of the fifth transistor.

13. The RF mixer of claim 11, further comprising capacitive elements forming a resonant circuit with the primary and secondary windings of the first transformer.

14. The RF mixer of claim 11, further comprising inductive load means including a second transformer which has primary and secondary windings, the primary winding being divided to two winding sections, each section being coupled to the collectors of the first and fourth transistors, respectively.

15. The RF mixer of claim 14, wherein the primary and secondary windings of the second transformer are microstrip inductor elements provided by the layer of metallization on top of the dielectric layer formed on the low resistivity silicon substrate, the micro inductor elements being isolated from the silicon substrate by the dielectric layer.

16. The RF mixer of claim 11, further comprising an impedance matching element which is connected between the bases of the first and second transistors of the first differential transistor pair and between the bases of the fourth and third transistors of the second differential transistor pair, the differential local oscillation signal being fed across the impedance matching element.

17. The RF mixer of claim 11, wherein the dielectric layer is a silicon dioxide layer.

18. An RF receiver fabricated on a silicon monolithic integrated circuit, the receiver comprising:

a first transformer having first and second windings which are microstrip inductor elements provided by a layer of metallization on top of a dielectric layer formed on a low resistivity silicon substrate, the micro inductor elements being isolated from the silicon substrate by the dielectric layer mutually and inductively coupled with each other;

a first transistor formed in the low resistivity silicon substrate, the first transistor having a base, a collector and an emitter, first and second voltages being supplied via the first and second windings of the first transformer to the emitter and collector of the first transistor, respectively;

a first differential transistor pair including second and third transistors formed in the low resistivity silicon substrate, each transistor having a base, a collector and an emitter, the emitters of the second and third transistors being coupled to each other;

a second differential transistor pair including fourth and fifth transistors formed in the low resistivity silicon substrate, each transistor having a base, a collector and an emitter, the emitters of the fourth and fifth transistors being coupled to each other, the collectors of the fourth and fifth transistors being coupled to the collectors of the second and third transistors, respectively, the bases of the fourth and fifth transistors being coupled to the bases of the third and second transistors, respectively;

a second transformer of a balun type having primary and secondary windings which are microstrip inductor elements provided by the layer of metallization on top of the dielectric layer formed on the low resistivity silicon substrate, the micro inductor elements being isolated from the silicon substrate by the dielectric layer, the secondary winding being divided to two winding sections, the two winding sections of the secondary winding being connected in series between the coupled emitters of the first and second differential transistor pairs;

current means connected to the junction of the two divided winding sections of the secondary winding of the second transformer;

means for coupling a differential local oscillation signal between the bases of the second and third transistors and between the bases of the fifth and fourth transistors;

means for coupling an RF input signal to the base of the first transistor; and means for coupling an amplified signal from the collector of the first transistor across the primary winding of the second transformer, thereby a balanced signal being provided across the secondary winding of the second transformer, in which a mixed signal of the RF input signal and the local oscillation signal is provided from the collectors of the second and the fifth transistors.

19. The RF receiver of claim 18, wherein the dielectric layer is a silicon dioxide layer.

20. The RF receiver of claim 18, further comprising load means including a third transformer having primary and secondary windings, the primary winding being divided to two winding sections, each winding section being coupled to the collectors of the second and fifth transistors, respectively.

21. The RF receiver of claim 20, wherein the primary and secondary windings of the third transformer are microstrip inductor elements provided by the layer of metallization on top of the dielectric layer formed on the low resistivity silicon substrate, the micro inductor elements being isolated from the silicon substrate by the dielectric layer.

* * * * *